(12) United States Patent
Kajiwara et al.

(10) Patent No.: US 11,398,497 B2
(45) Date of Patent: Jul. 26, 2022

(54) THREE-DIMENSIONAL MEMORY DEVICE CONTAINING AUXILIARY SUPPORT PILLAR STRUCTURES AND METHOD OF MAKING THE SAME

(71) Applicant: SANDISK TECHNOLOGIES LLC, Addison, TX (US)

(72) Inventors: Kengo Kajiwara, Yokkaichi (JP); Atsushi Shimoda, Yokkaichi (JP); Tatsuya Hinoue, Yokkaichi (JP); Junpei Kanazawa, Yokkaichi (JP); Masanori Terahara, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 46 days.

(21) Appl. No.: 16/876,370

(22) Filed: May 18, 2020

(65) Prior Publication Data

US 2021/0358941 A1 Nov. 18, 2021

(51) Int. Cl.
*H01L 27/1157* (2017.01)
*H01L 27/11582* (2017.01)
(Continued)

(52) U.S. Cl.
CPC .. *H01L 27/11582* (2013.01); *H01L 21/76816* (2013.01); *H01L 21/76877* (2013.01);
(Continued)

(58) Field of Classification Search
CPC ......... H01L 27/11582; H01L 21/76816; H01L 21/76877; H01L 23/5226; H01L 23/5283;
(Continued)

(56) References Cited

U.S. PATENT DOCUMENTS 5,915,167 A 6/1999 Leedy
9,230,987 B2 1/2016 Pachamuthu et al.
(Continued)

FOREIGN PATENT DOCUMENTS

WO WO 2018038785 A1 3/2018

OTHER PUBLICATIONS

U.S. Appl. No. 16/276,952, filed Feb. 15, 2019, SanDisk Technologies LLC.
(Continued)

*Primary Examiner* — Thanh T Nguyen
(74) *Attorney, Agent, or Firm* — The Marbury Law Group PLLC

(57) ABSTRACT

A three-dimensional memory device includes a first-tier structure located over a substrate and including a first alternating stack of first insulating layers and first electrically conductive layers. a second-tier structure located over the first-tier structure and including a second alternating stack of second insulating layers and second electrically conductive layers, memory stack structures vertically extending through the first alternating stack and the second alternating stack, primary support pillar structures, and auxiliary support pillar structures vertically extending through the first alternating stack, underlying the second stepped surfaces, and located below a horizontal plane including a bottommost surface of the second alternating stack.

20 Claims, 44 Drawing Sheets

(51) Int. Cl.
*H01L 27/11524* (2017.01)
*H01L 27/11556* (2017.01)
*H01L 27/11519* (2017.01)
*H01L 21/768* (2006.01)
*H01L 23/522* (2006.01)
*H01L 23/528* (2006.01)
*H01L 23/00* (2006.01)
*H01L 27/11565* (2017.01)

(52) U.S. Cl.
CPC ...... *H01L 23/5226* (2013.01); *H01L 23/5283* (2013.01); *H01L 23/562* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC ............ H01L 23/562; H01L 27/11519; H01L 27/11524; H01L 27/11556; H01L 27/11565; H01L 27/1157
See application file for complete search history.

(56) References Cited

U.S. PATENT DOCUMENTS

| | | |
|---|---|---|
| 9,412,749 B1 | 8/2016 | Shimabukuro et al. |
| 9,576,967 B1 | 2/2017 | Kimura et al. |
| 9,659,956 B1 | 5/2017 | Pachamuthu et al. |
| 9,754,963 B1 * | 9/2017 | Kawamura ....... H01L 27/11556 |
| 9,853,038 B1 | 12/2017 | Cui |
| 9,881,929 B1 | 1/2018 | Ravikirthi et al. |
| 9,905,573 B1 | 2/2018 | Mada et al. |
| 9,978,766 B1 | 5/2018 | Hosoda et al. |
| 10,014,316 B2 | 7/2018 | Yu et al. |
| 10,115,632 B1 | 10/2018 | Masamori et al. |
| 10,141,331 B1 | 11/2018 | Susuki et al. |
| 10,256,245 B2 | 4/2019 | Ariyoshi |
| 10,269,820 B1 | 4/2019 | Kaminaga |
| 10,381,434 B1 | 8/2019 | Pachamuthu et al. |
| 10,475,879 B1 | 11/2019 | Pachamuthu et al. |
| 2015/0236038 A1 | 8/2015 | Pachamuthu et al. |
| 2018/0061850 A1 | 3/2018 | Mada et al. |
| 2018/0108671 A1 | 4/2018 | Yu et al. |
| 2018/0130812 A1 | 5/2018 | Hosoda et al. |
| 2018/0261613 A1 | 9/2018 | Ariyoshi |
| 2018/0301374 A1 | 10/2018 | Masamori et al. |
| 2018/0342531 A1 | 11/2018 | Susuki et al. |
| 2019/0229125 A1 * | 7/2019 | Zhou ................. H01L 27/11556 |

OTHER PUBLICATIONS

U.S. Appl. No. 16/276,996, filed Feb. 15, 2019, SanDisk Technologies LLC.
U.S. Appl. No. 16/284,240, filed Feb. 25, 2019, SanDisk Technologies LLC.
U.S. Appl. No. 16/361,773, filed Mar. 22, 2019, SanDisk Technologies LLC.
U.S. Appl. No. 16/368,007, filed Mar. 28, 2019, SanDisk Technologies LLC.
U.S. Appl. No. 16/692,027, filed Nov. 22, 2019, SanDisk Technologies LLC.
Notification of Transmittal of the International Search Report and the Written Opinion of the International Searching Authority for International Patent Application No. PCTUS2021/012542, dated Apr. 26, 2021, 9 pages.

* cited by examiner

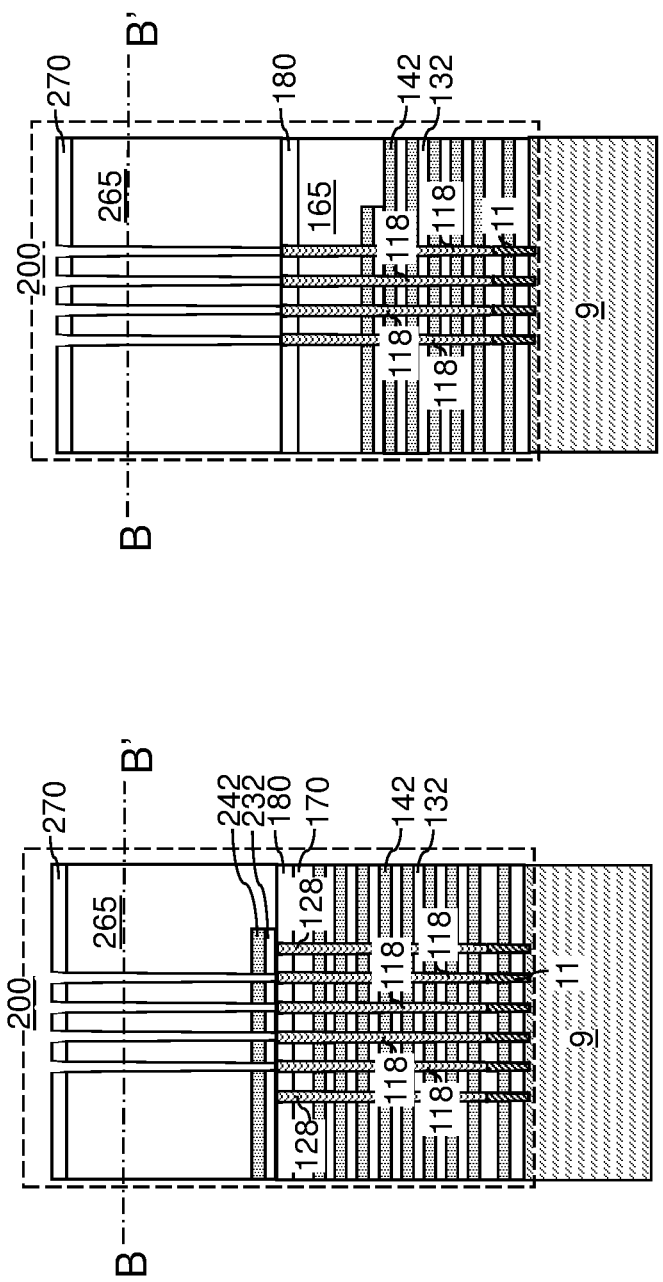

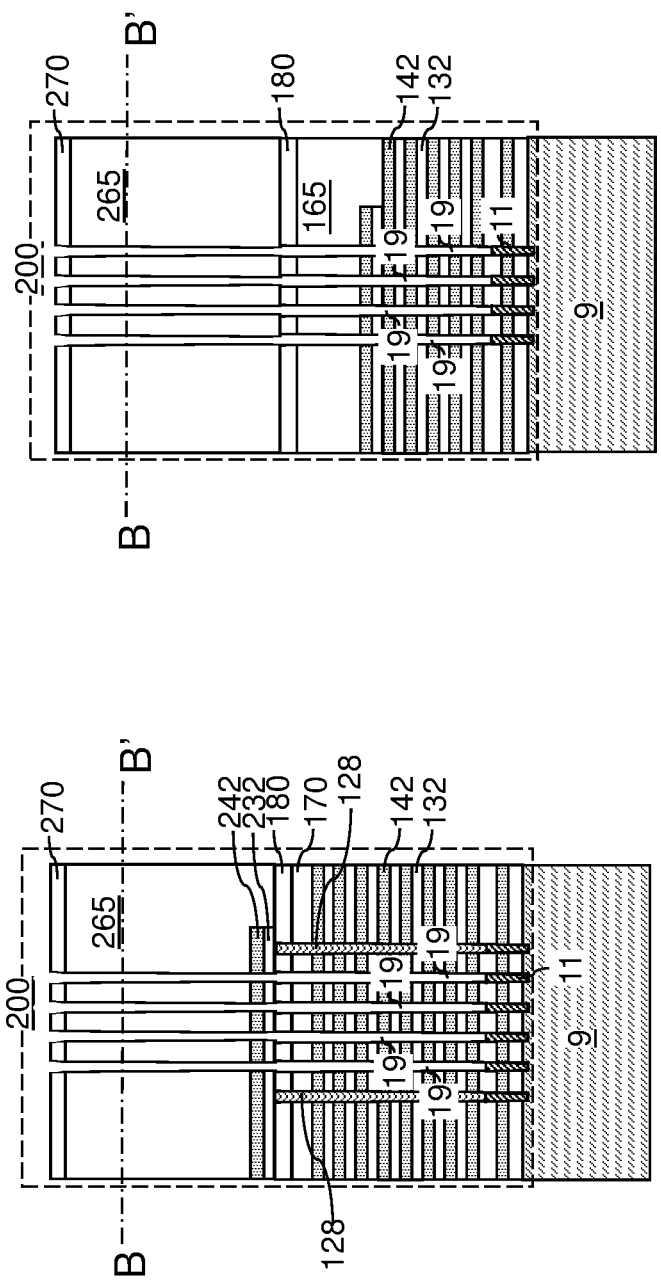

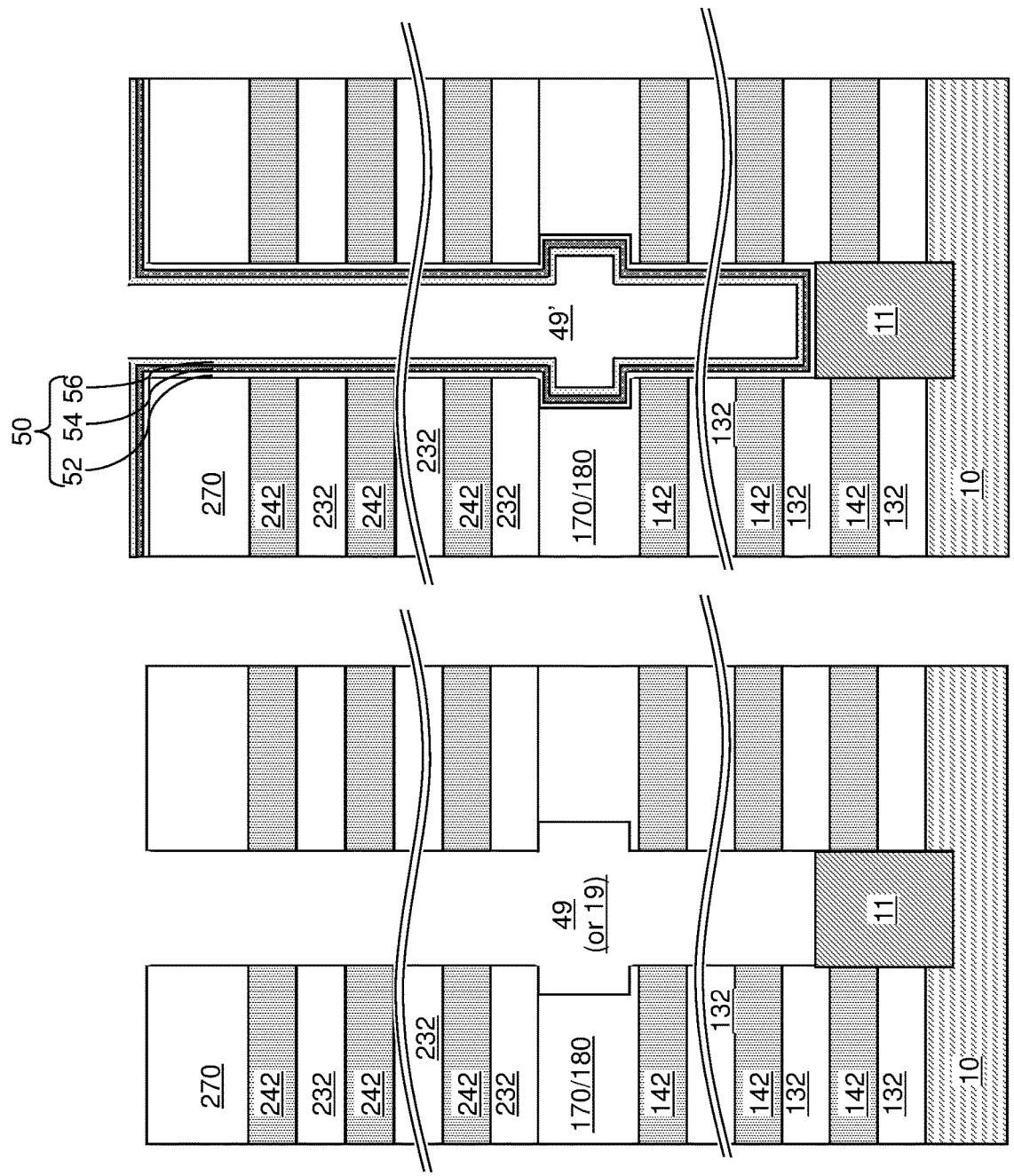

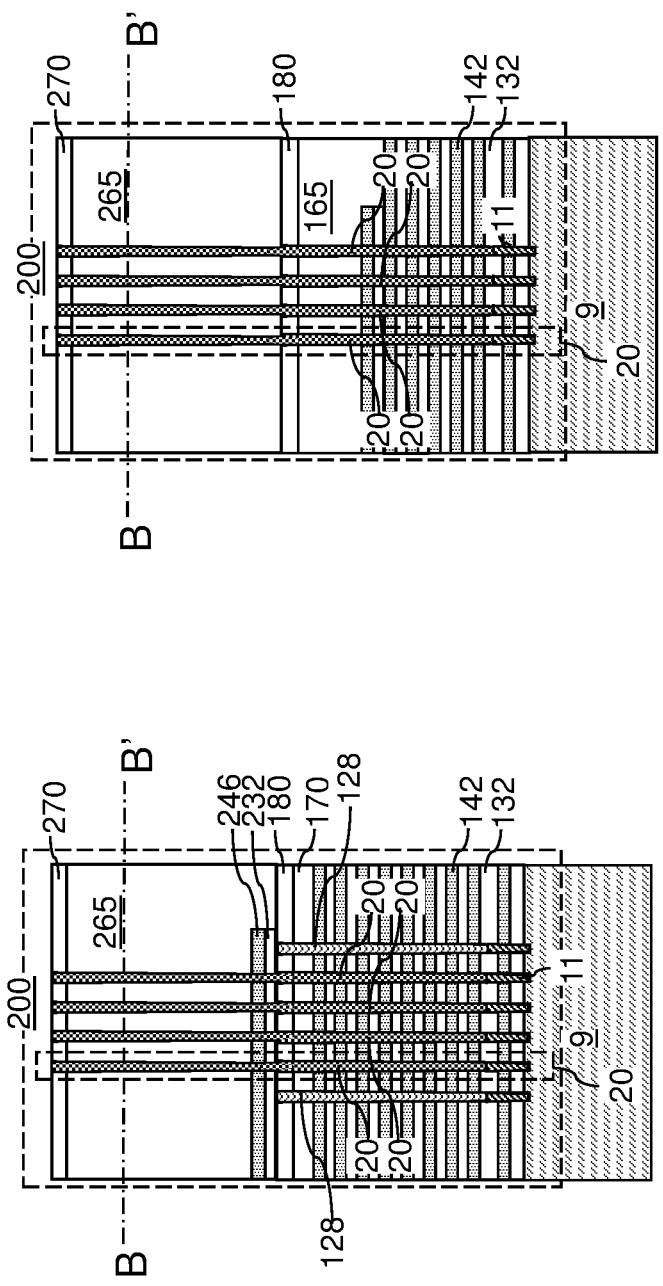

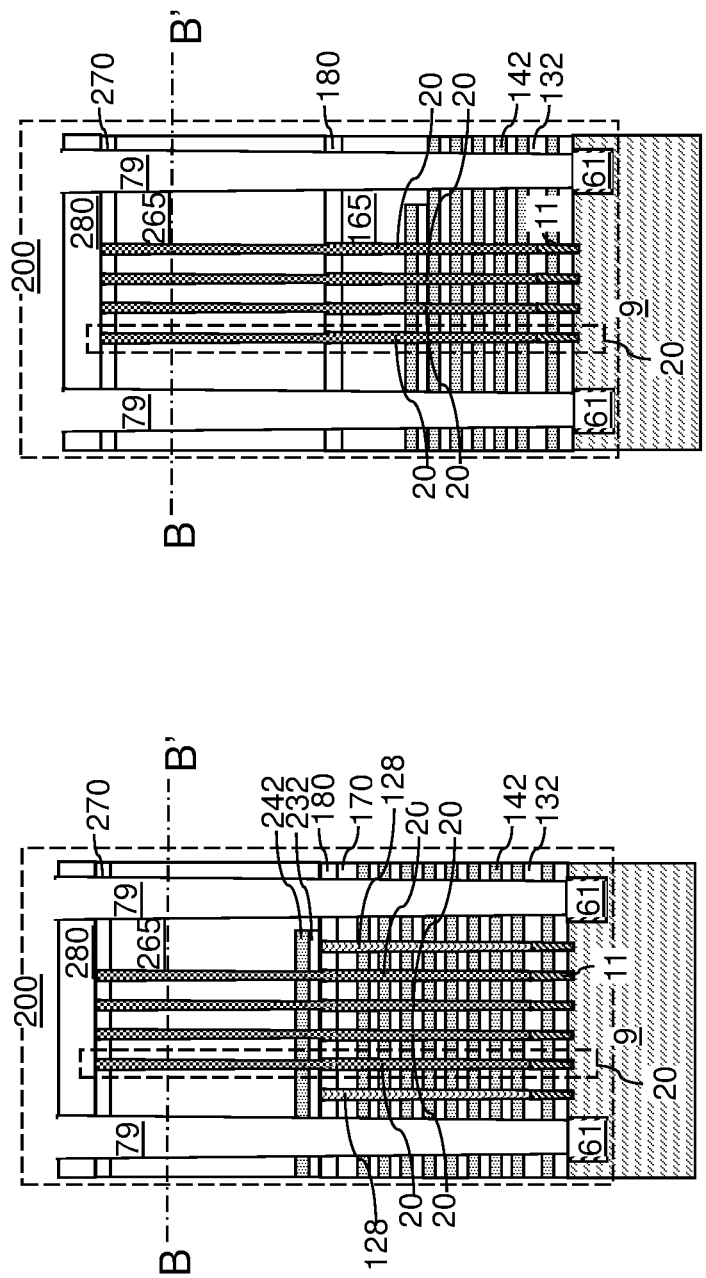

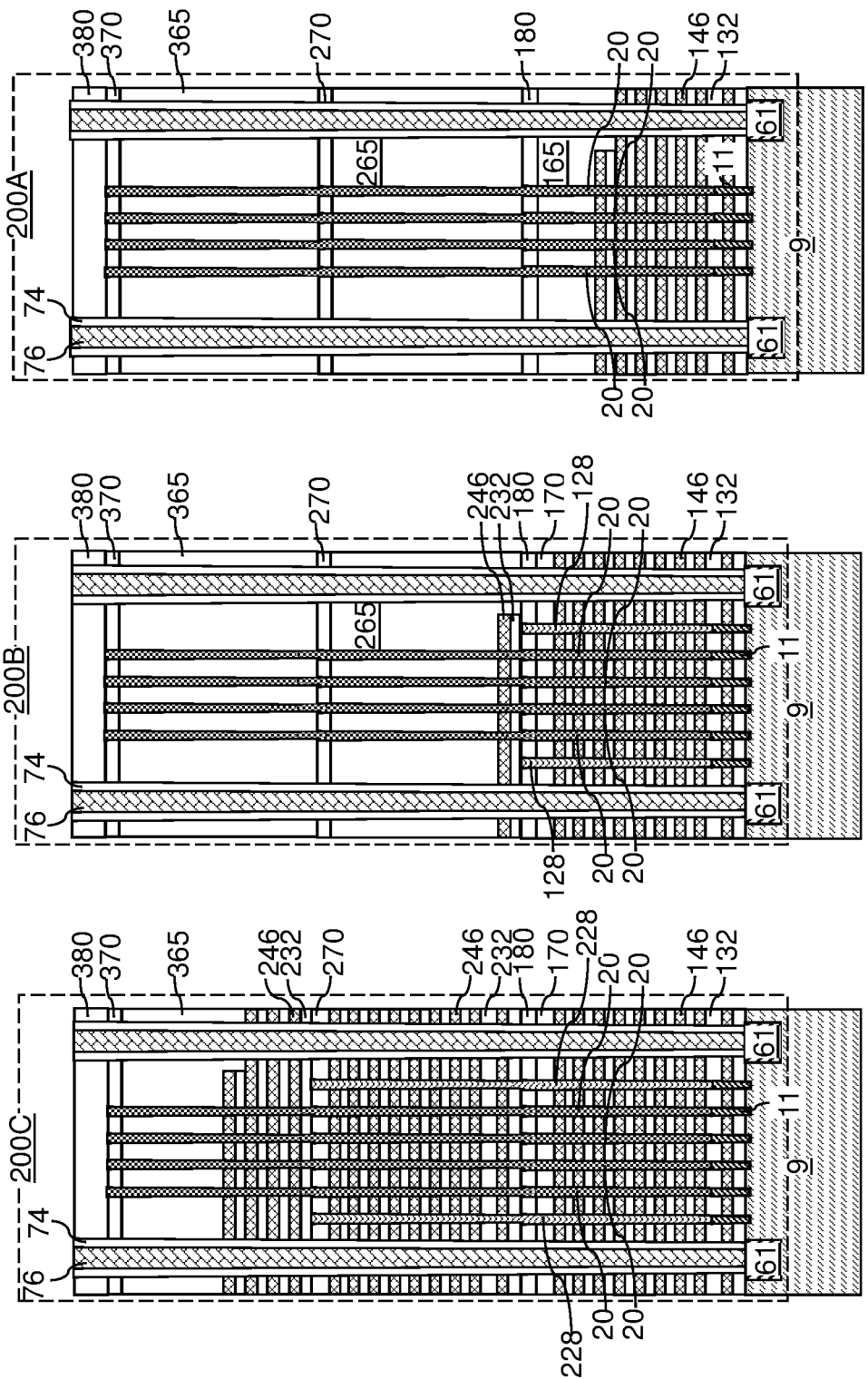

THREE-DIMENSIONAL MEMORY DEVICE CONTAINING AUXILIARY SUPPORT PILLAR STRUCTURES AND METHOD OF MAKING THE SAME

FIELD

The present disclosure relates generally to the field of semiconductor devices and specifically to a three-dimensional memory device containing auxiliary support pillar structures and methods of making the same.

BACKGROUND

Recently, ultra-high-density storage devices employing three-dimensional (3D) memory stack structures have been proposed. Such memory stack structures can employ an architecture known as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel.

SUMMARY

According to an aspect of the present disclosure, a three-dimensional memory device is provided, which comprises: a first-tier structure located over a substrate and comprising a first alternating stack of first insulating layers and first electrically conductive layers and comprising a first retro-stepped dielectric material portion overlying, and contacting, first stepped surfaces of the first alternating stack; a second-tier structure located over the first-tier structure and comprising a second alternating stack of second insulating layers and second electrically conductive layers and comprising a second retro-stepped dielectric material portion overlying, and contacting, second stepped surfaces of the second alternating stack; memory stack structures vertically extending through the first alternating stack and the second alternating stack, wherein each of the memory stack structures comprises a memory film and a vertical semiconductor channel; primary support pillar structures, wherein a portion of the primary support pillar structures vertically extend through the second retro-stepped dielectric material portion, the first alternating stack and the second alternating stack; and auxiliary support pillar structures vertically extending through the first alternating stack, underlying the second stepped surfaces, and located below a horizontal plane including a bottommost surface of the second alternating stack.

According to another aspect of the present disclosure, a method of forming a three-dimensional memory device is provided, which comprises: forming a first-tier structure located over a substrate, wherein the first-tier structure comprises a first alternating stack of first insulating layers and first sacrificial material layers and a first retro-stepped dielectric material portion overlying, and contacting, first stepped surfaces of the first alternating stack; forming auxiliary support pillar structures through the first-tier structure; forming a second-tier structure over the first-tier structure, wherein the second-tier structure comprises a second alternating stack of second insulating layers and second sacrificial material layers; forming primary support pillar structures and memory stack structures through the second-tier structure and the first-tier structure while the auxiliary support pillar structures remain covered with the second alternating stack; and replacing the first sacrificial material layers and the second sacrificial material layers with first electrically conductive layers and second electrically conductive layers, respectively.

Figure 7A:
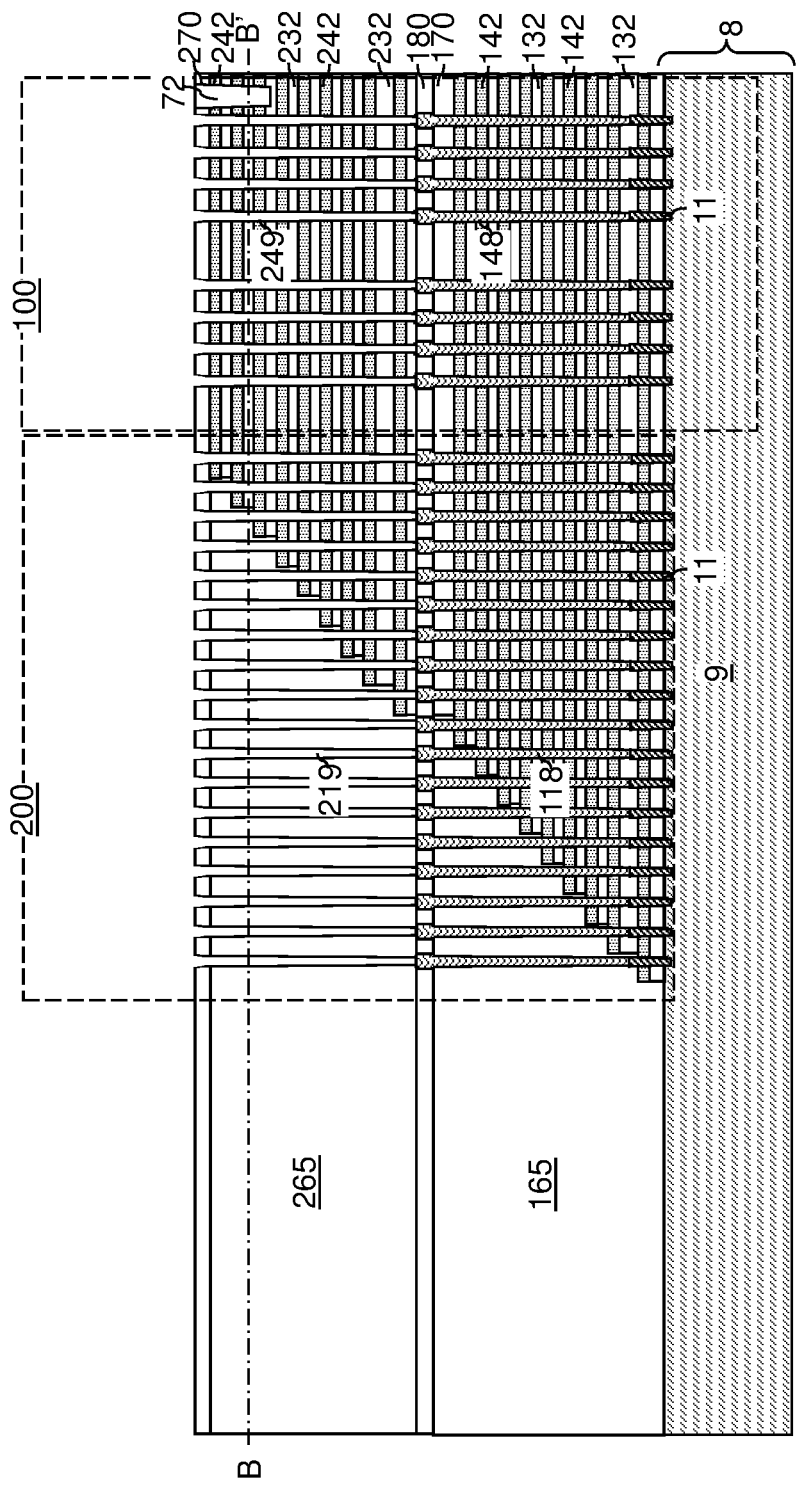
FIG. 7A is a vertical cross-sectional view of the first exemplary structure after formation of second-tier memory openings and second-tier support openings according to an embodiment of the present disclosure.

7A. The hinged vertical plane A-A' corresponds to the plane of the vertical cross-sectional view of FIG. 7A.

Figure 7B:
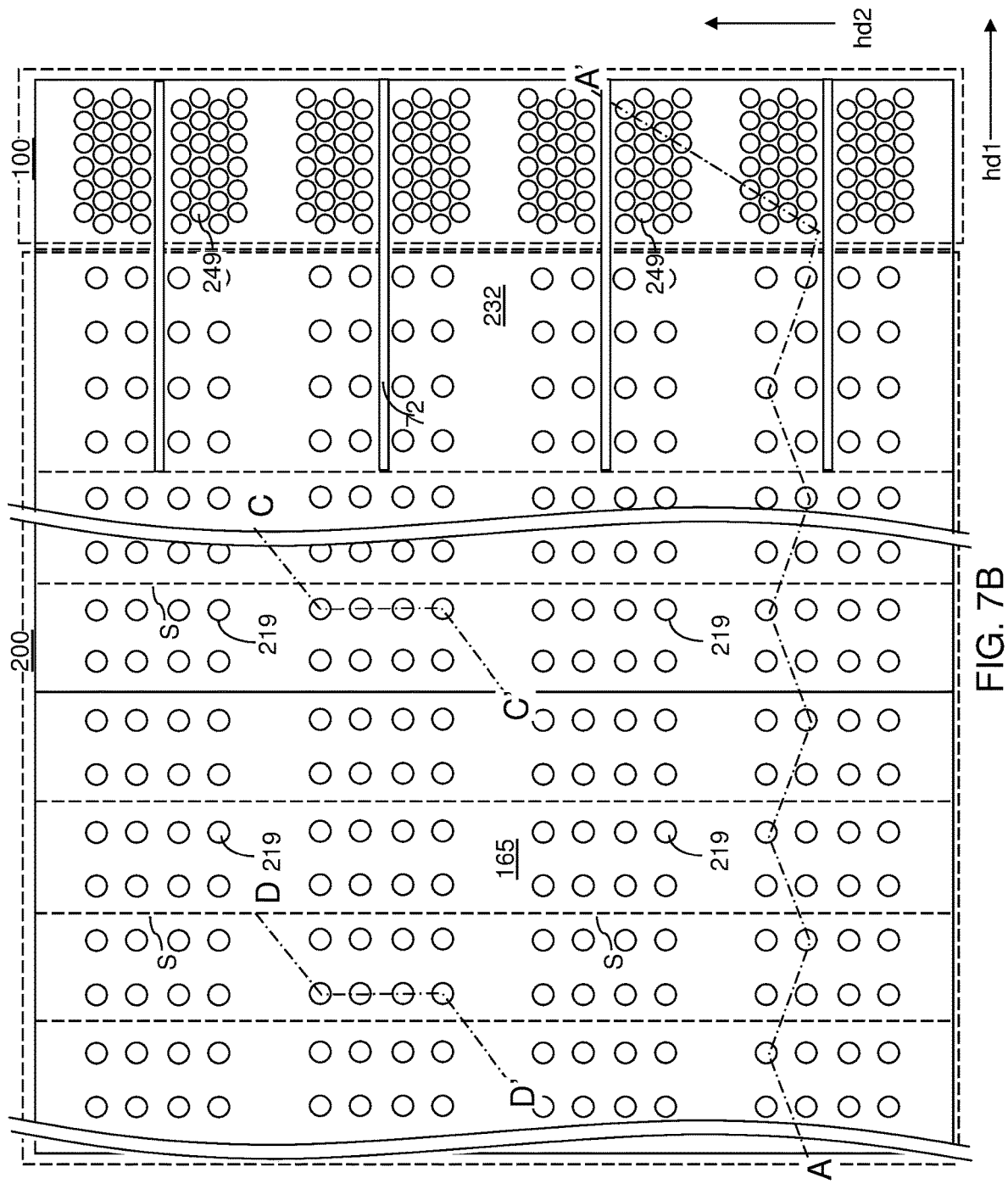
FIG. 7B is a horizontal cross-sectional view of the first exemplary structure along the horizontal plane B-B' in FIG.

FIG. 7C is a vertical cross-sectional view of the first exemplary structure along the hinged vertical plane C-C' of FIG. 7B.

FIG. 7D is a vertical cross-sectional view of the first exemplary structure along the hinged vertical plane D-D' of FIG. 7B.

Figure 8A:
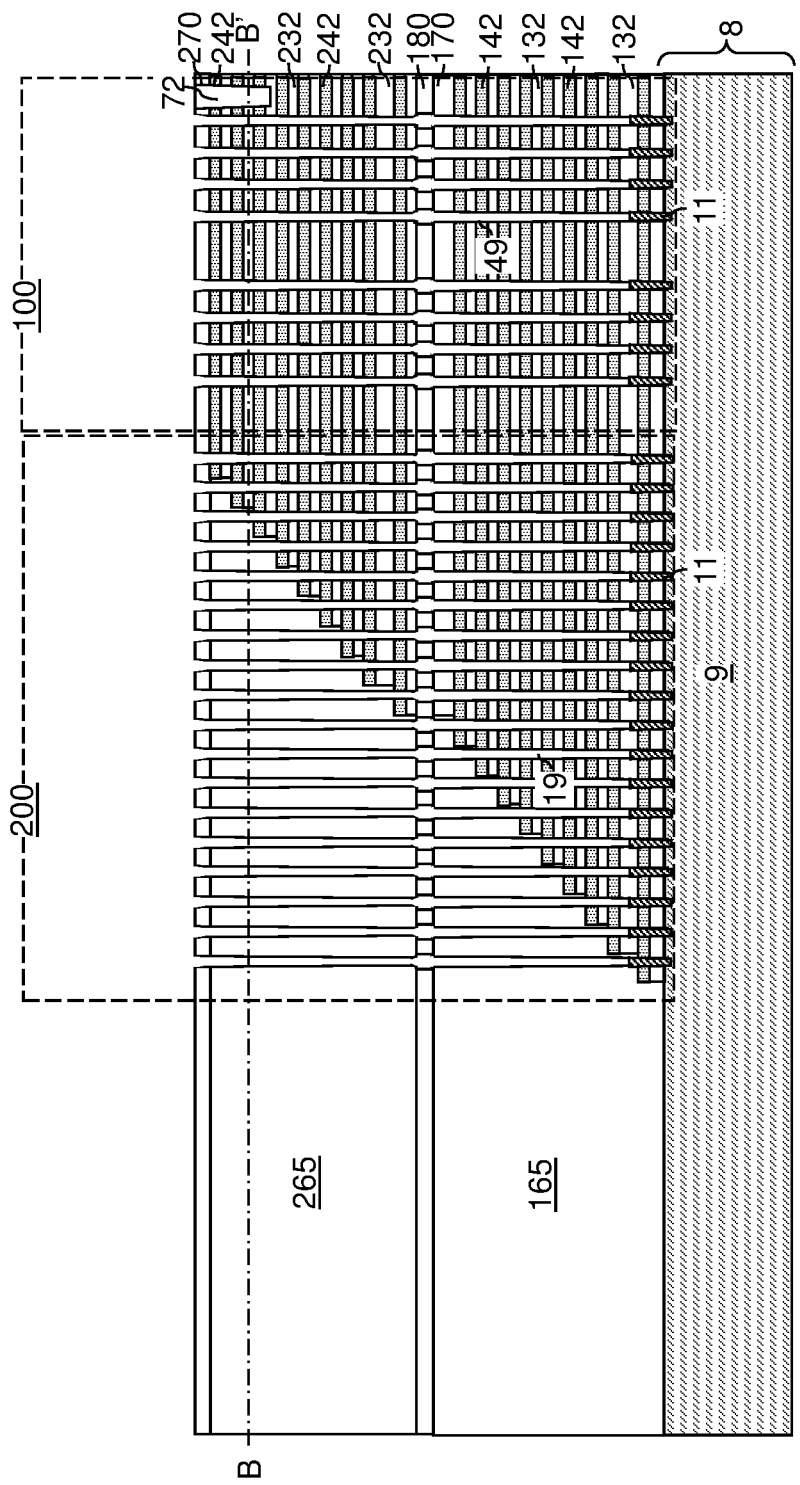

FIG. 8A is a vertical cross-sectional view of the first exemplary structure after formation of inter-tier memory openings and inter-tier support openings according to an embodiment of the present disclosure.

Figure 8B:
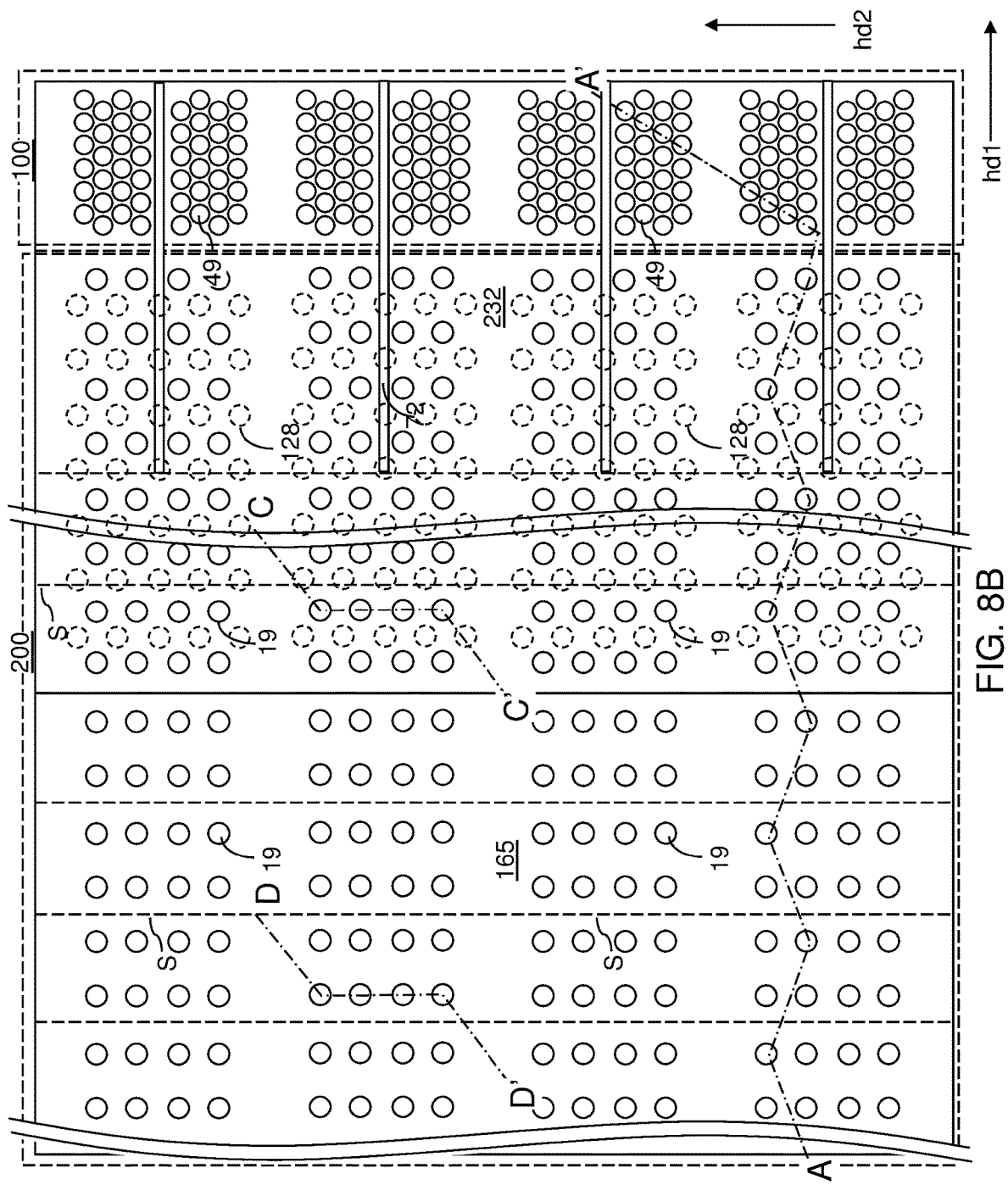

FIG. 8B is a horizontal cross-sectional view of the first exemplary structure along the horizontal plane B-B' in FIG. 8A. The hinged vertical plane A-A' corresponds to the plane of the vertical cross-sectional view of FIG. 8A.

FIG. 8C is a vertical cross-sectional view of the first exemplary structure along the hinged vertical plane C-C' of FIG. 8B.

FIG. 8D is a vertical cross-sectional view of the first exemplary structure along the hinged vertical plane D-D' of FIG. 8B.

FIGS. 9A-9H are sequential vertical cross-sectional views of an inter-tier memory opening during formation of a memory opening fill structure according to an embodiment of the present disclosure.

Figure 10A:
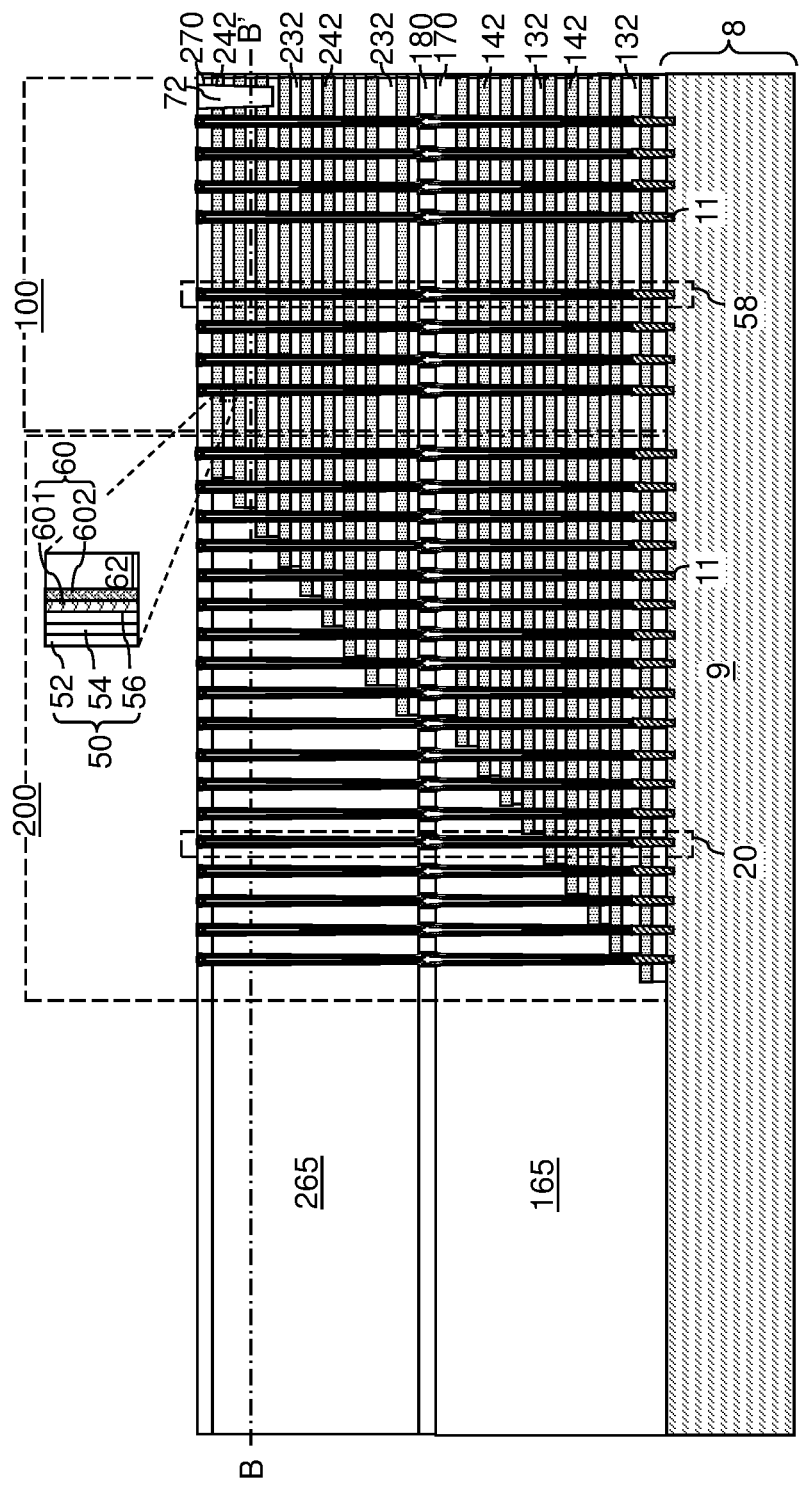

FIG. 10A is a vertical cross-sectional view of the first exemplary structure after formation of memory opening fill structures and primary support pillar structures according to an embodiment of the present disclosure.

Figure 10B:
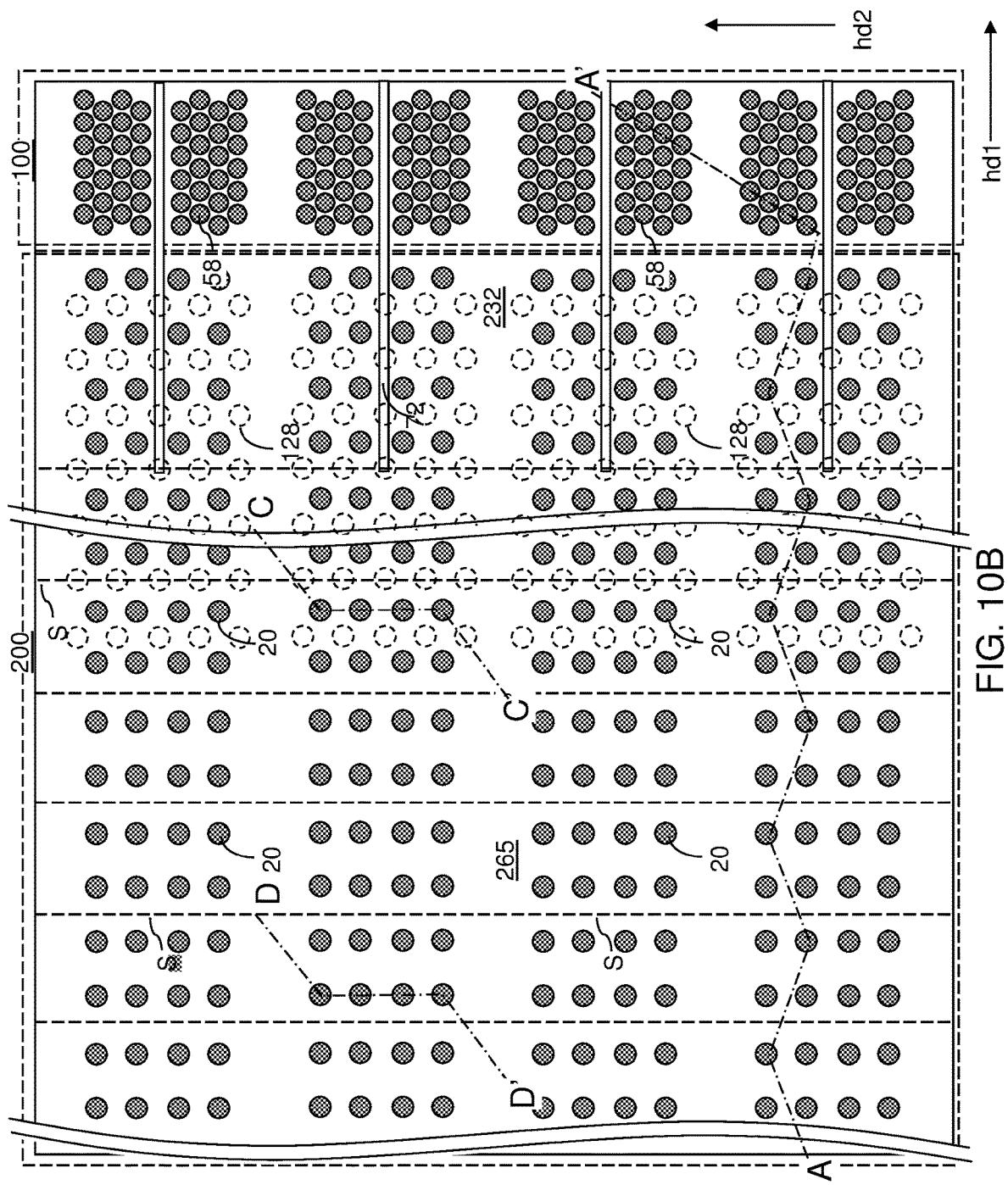

FIG. 10B is a horizontal cross-sectional view of the first exemplary structure along the horizontal plane B-B' in FIG. 10A. The hinged vertical plane A-A' corresponds to the plane of the vertical cross-sectional view of FIG. 10A.

FIG. 10C is a vertical cross-sectional view of the first exemplary structure along the hinged vertical plane C-C' of FIG. 10B.

FIG. 10D is a vertical cross-sectional view of the first exemplary structure along the hinged vertical plane D-D' of FIG. 10B.

Figure 11A:
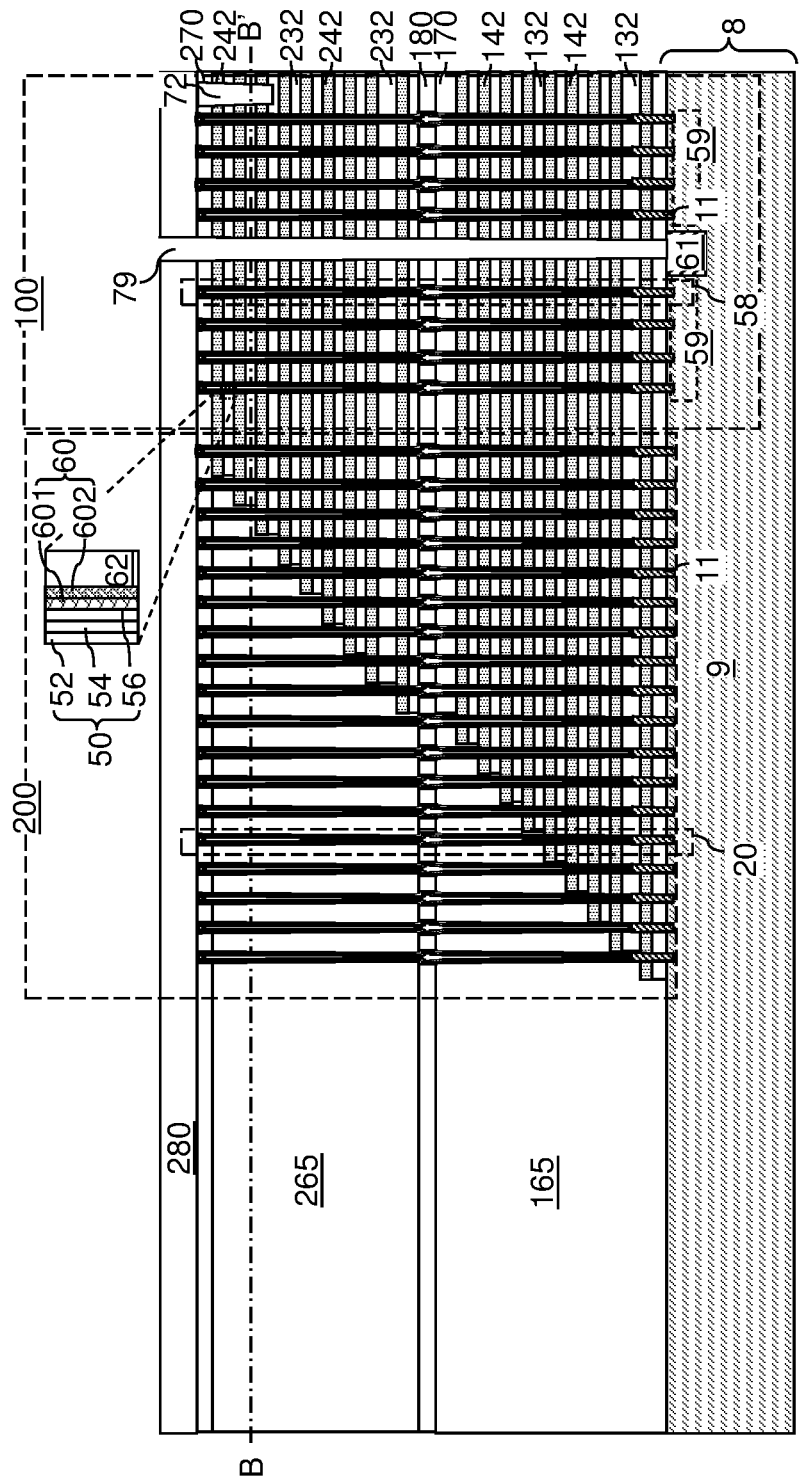

FIG. 11A is a vertical cross-sectional view of the first exemplary structure after formation of backside trenches and source regions according to an embodiment of the present disclosure.

Figure 11B:
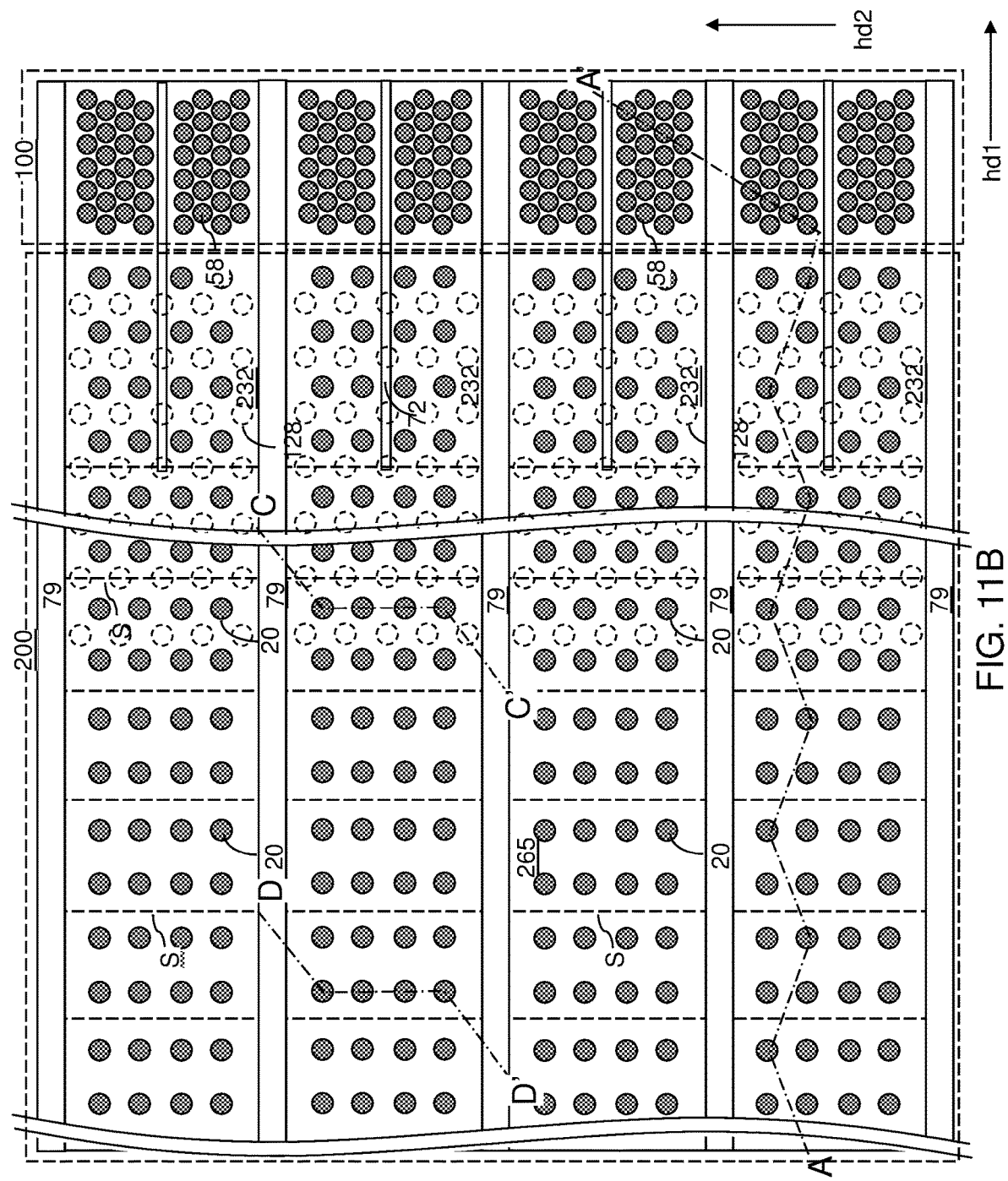

FIG. 11B is a horizontal cross-sectional view of the first exemplary structure along the horizontal plane B-B' in FIG. 11A. The hinged vertical plane A-A' corresponds to the plane of the vertical cross-sectional view of FIG. 11A.

FIG. 11C is a vertical cross-sectional view of the first exemplary structure along the hinged vertical plane C-C' of FIG. 11B.

FIG. 11D is a vertical cross-sectional view of the first exemplary structure along the hinged vertical plane D-D' of FIG. 11B.

Figure 12A:
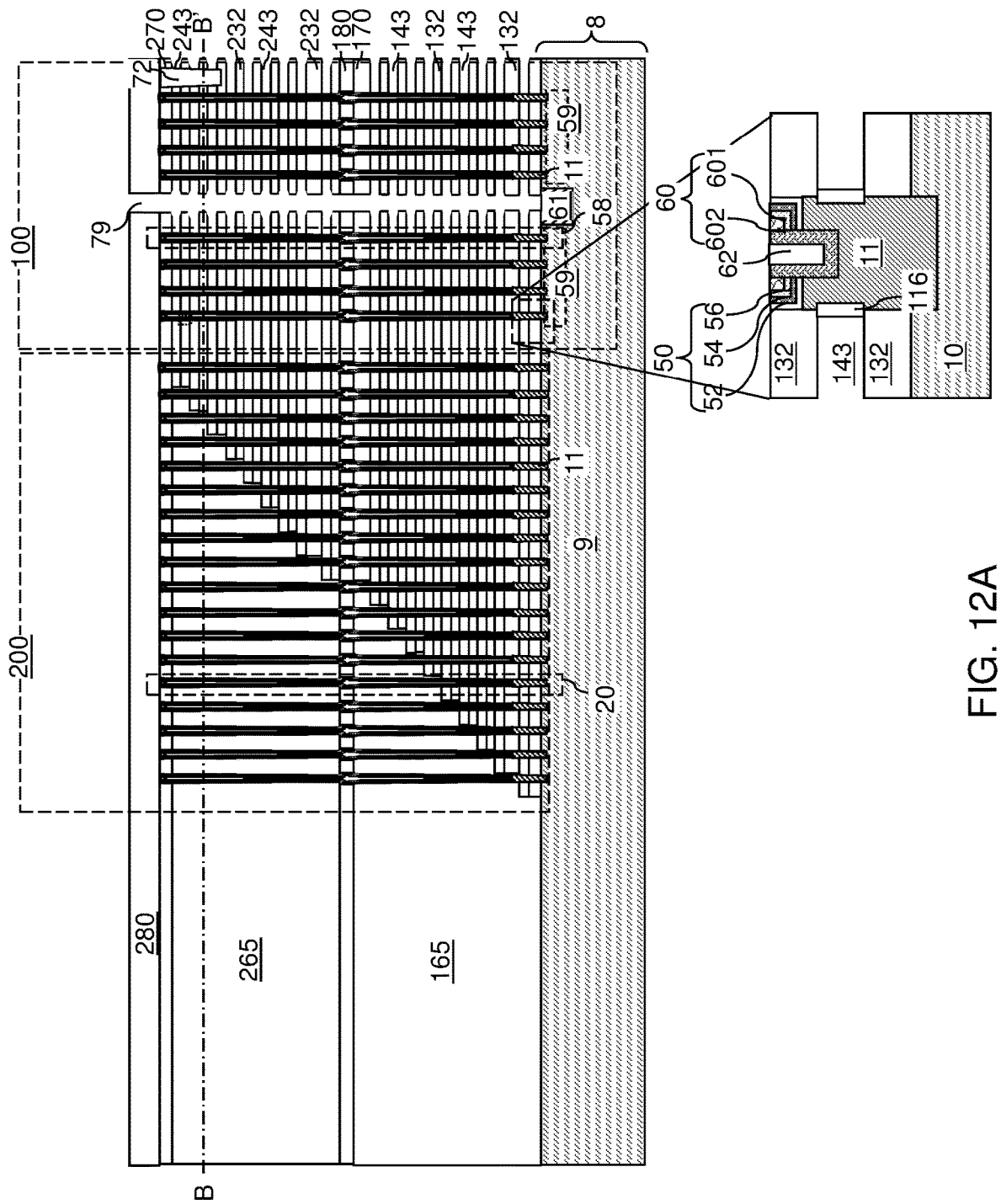

FIG. 12A is a vertical cross-sectional view of the first exemplary structure after formation of backside recesses according to an embodiment of the present disclosure.

Figure 12B:
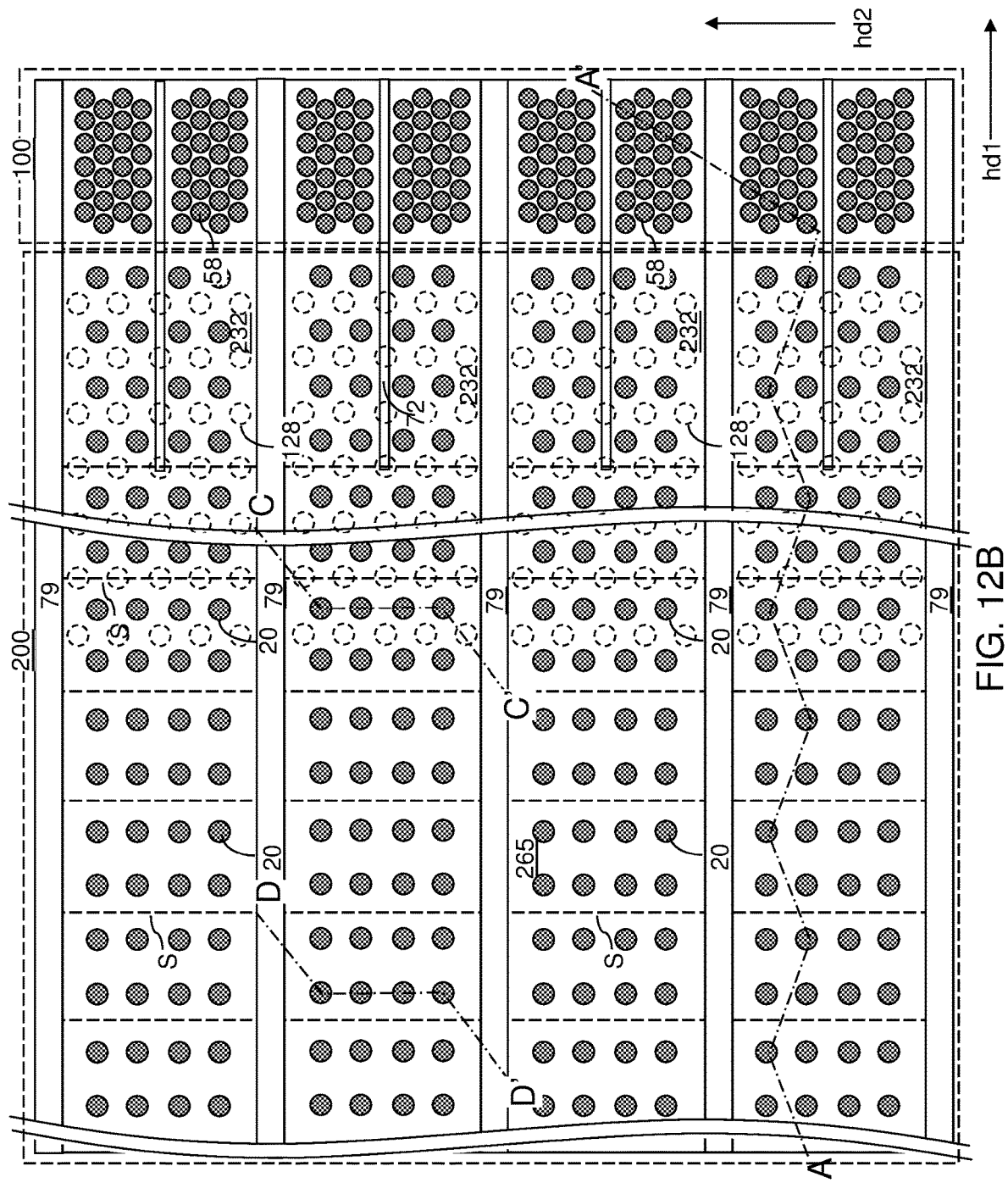

FIG. 12B is a horizontal cross-sectional view of the first exemplary structure along the horizontal plane B-B' in FIG. 12A. The hinged vertical plane A-A' corresponds to the plane of the vertical cross-sectional view of FIG. 12A.

Figure 12C:
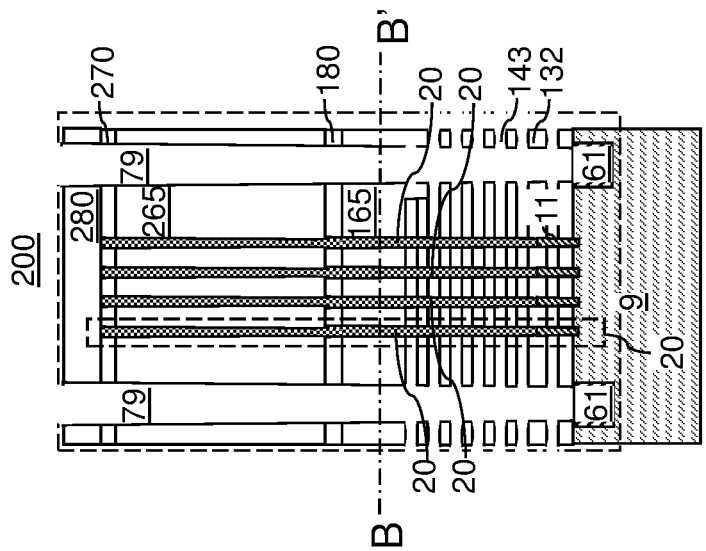

FIG. 12C is a vertical cross-sectional view of the first exemplary structure along the hinged vertical plane C-C' of FIG. 12B.

Figure 12D:
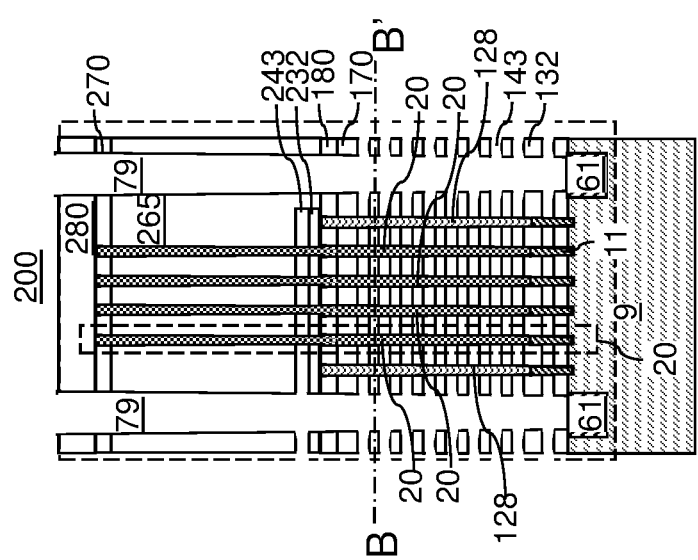

FIG. 12D is a vertical cross-sectional view of the first exemplary structure along the hinged vertical plane D-D' of FIG. 12B.

Figure 13A:
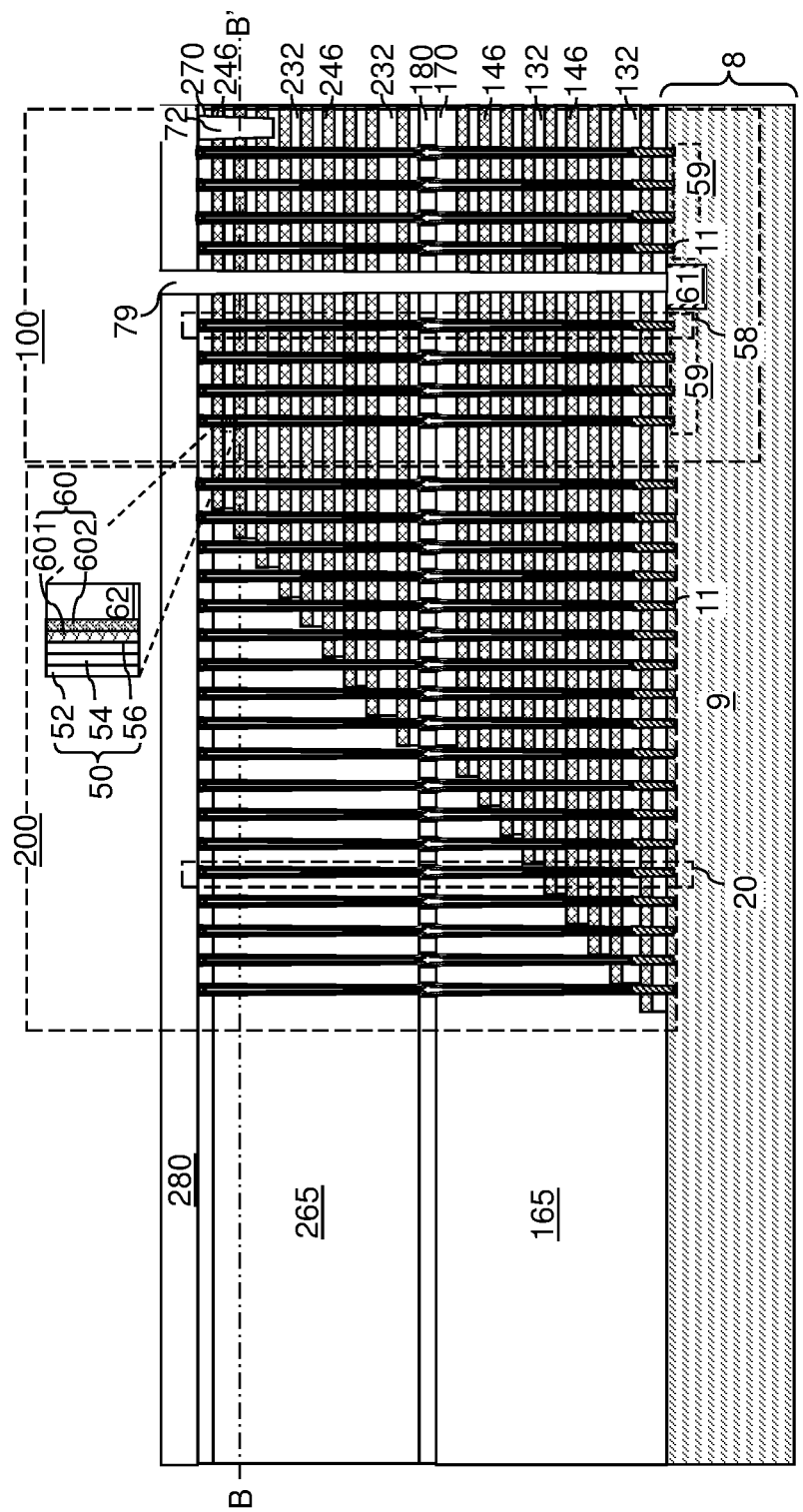

FIG. 13A is a vertical cross-sectional view of the first exemplary structure after replacement of sacrificial material layers with electrically conductive according to an embodiment of the present disclosure.

Figure 13B:
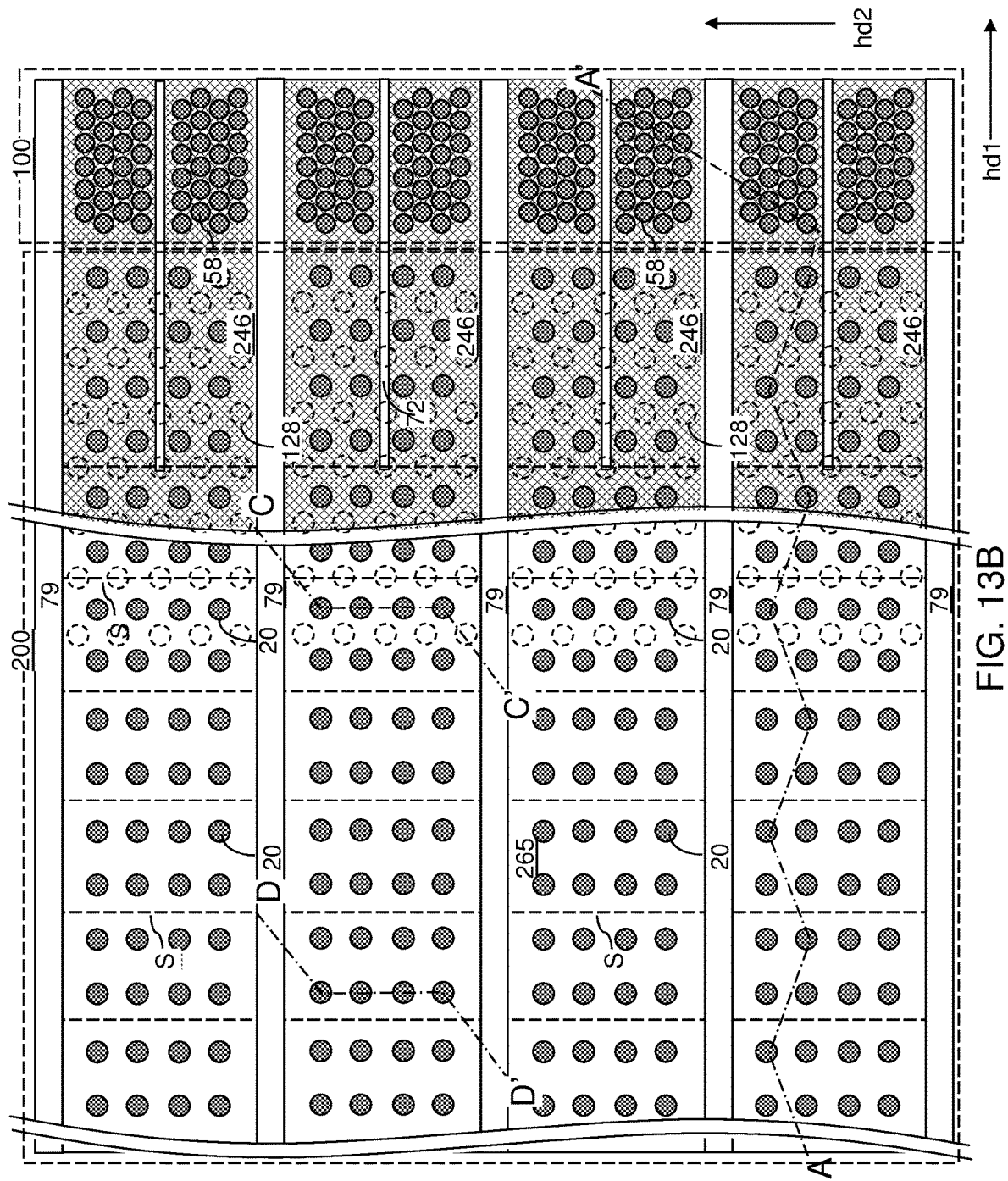

FIG. 13B is a horizontal cross-sectional view of the first exemplary structure along the horizontal plane B-B' in FIG. 13A. The hinged vertical plane A-A' corresponds to the plane of the vertical cross-sectional view of FIG. 13A.

Figure 13C:
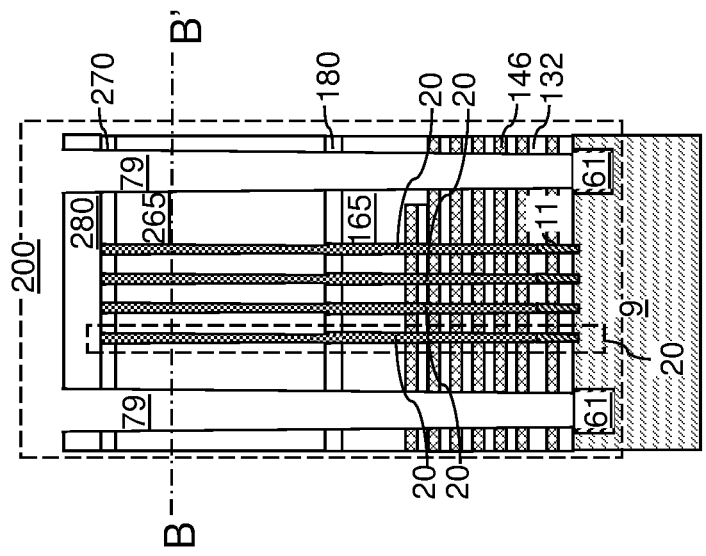

FIG. 13C is a vertical cross-sectional view of the first exemplary structure along the hinged vertical plane C-C' of FIG. 13B.

Figure 13D:
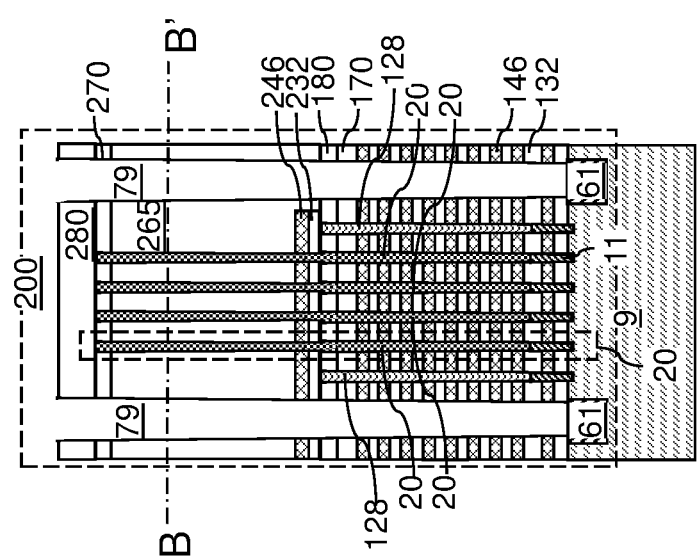

FIG. 13D is a vertical cross-sectional view of the first exemplary structure along the hinged vertical plane D-D' of FIG. 13B.

Figure 14A:
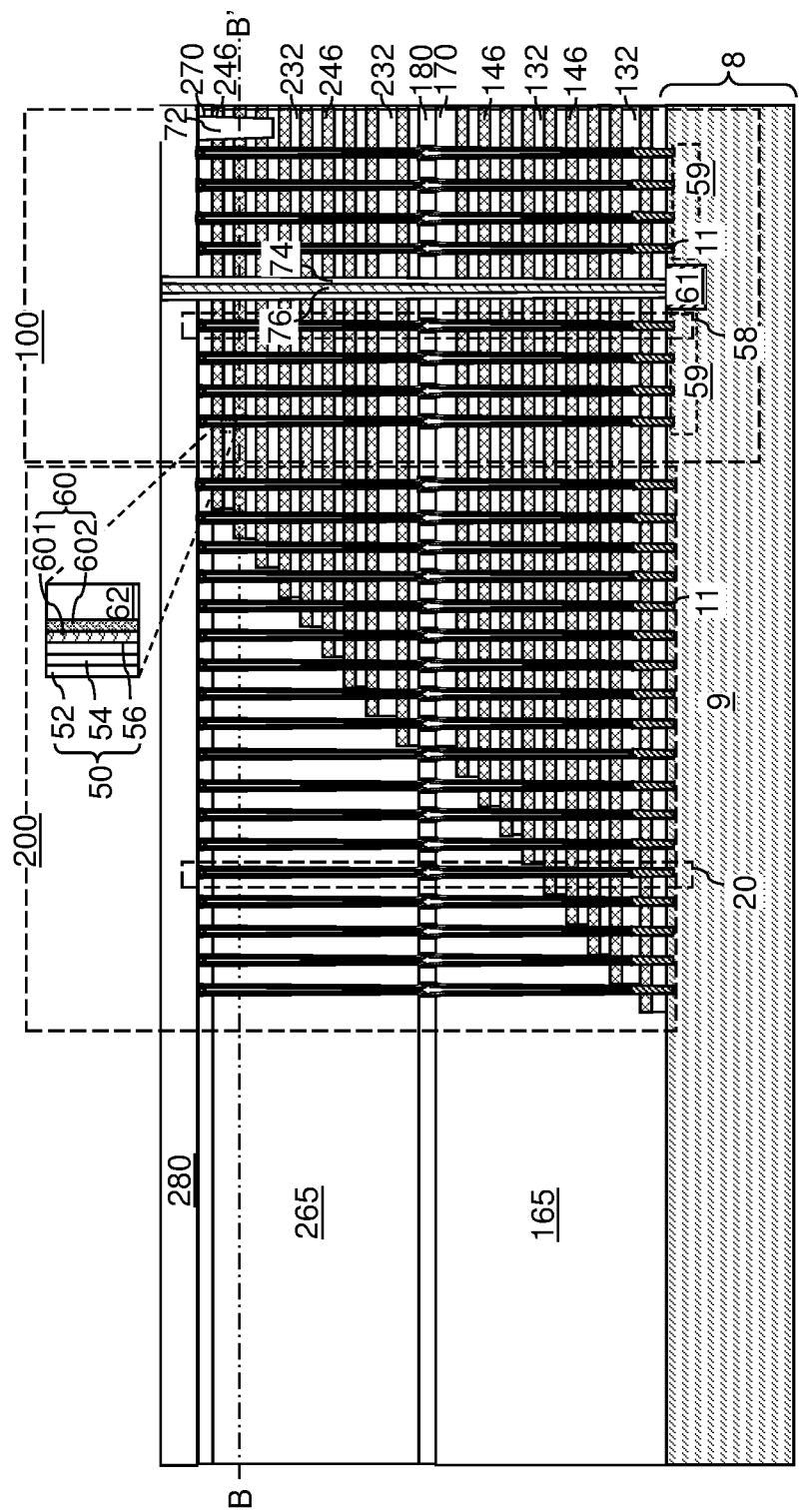

FIG. 14A is a vertical cross-sectional view of the first exemplary structure after formation of insulating spacers and backside via structures according to an embodiment of the present disclosure.

Figure 14B:
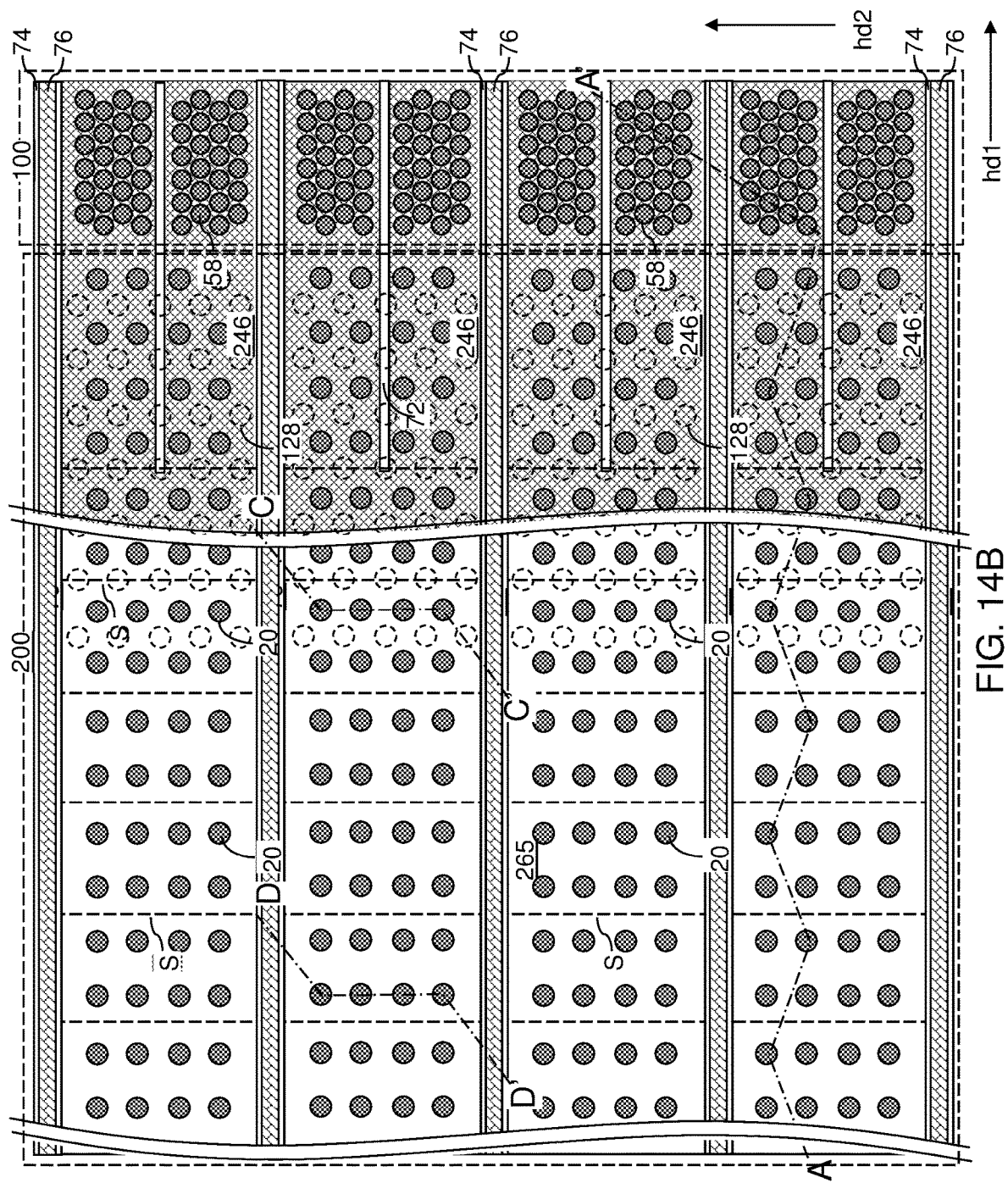

FIG. 14B is a horizontal cross-sectional view of the first exemplary structure along the horizontal plane B-B' in FIG. 14A. The hinged vertical plane A-A' corresponds to the plane of the vertical cross-sectional view of FIG. 14A.

Figure 14C:
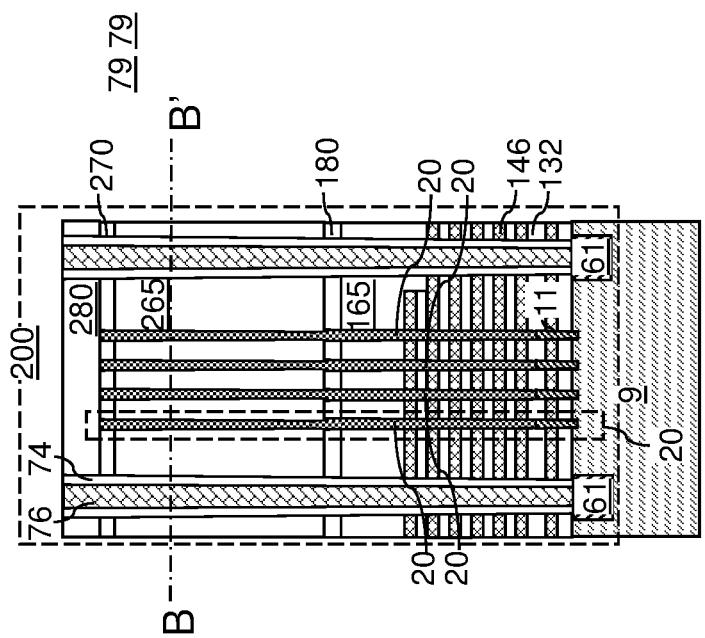

FIG. 14C is a vertical cross-sectional view of the first exemplary structure along the hinged vertical plane C-C' of FIG. 14B.

Figure 14D:
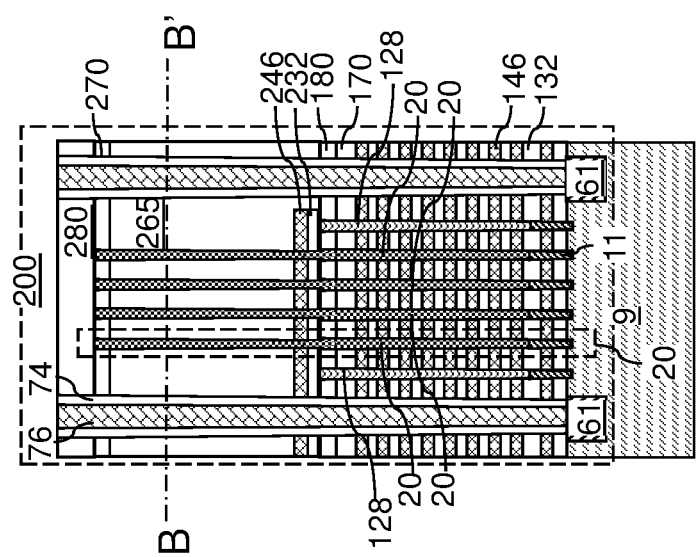

FIG. 14D is a vertical cross-sectional view of the first exemplary structure along the hinged vertical plane D-D' of FIG. 14B.

Figure 15A:
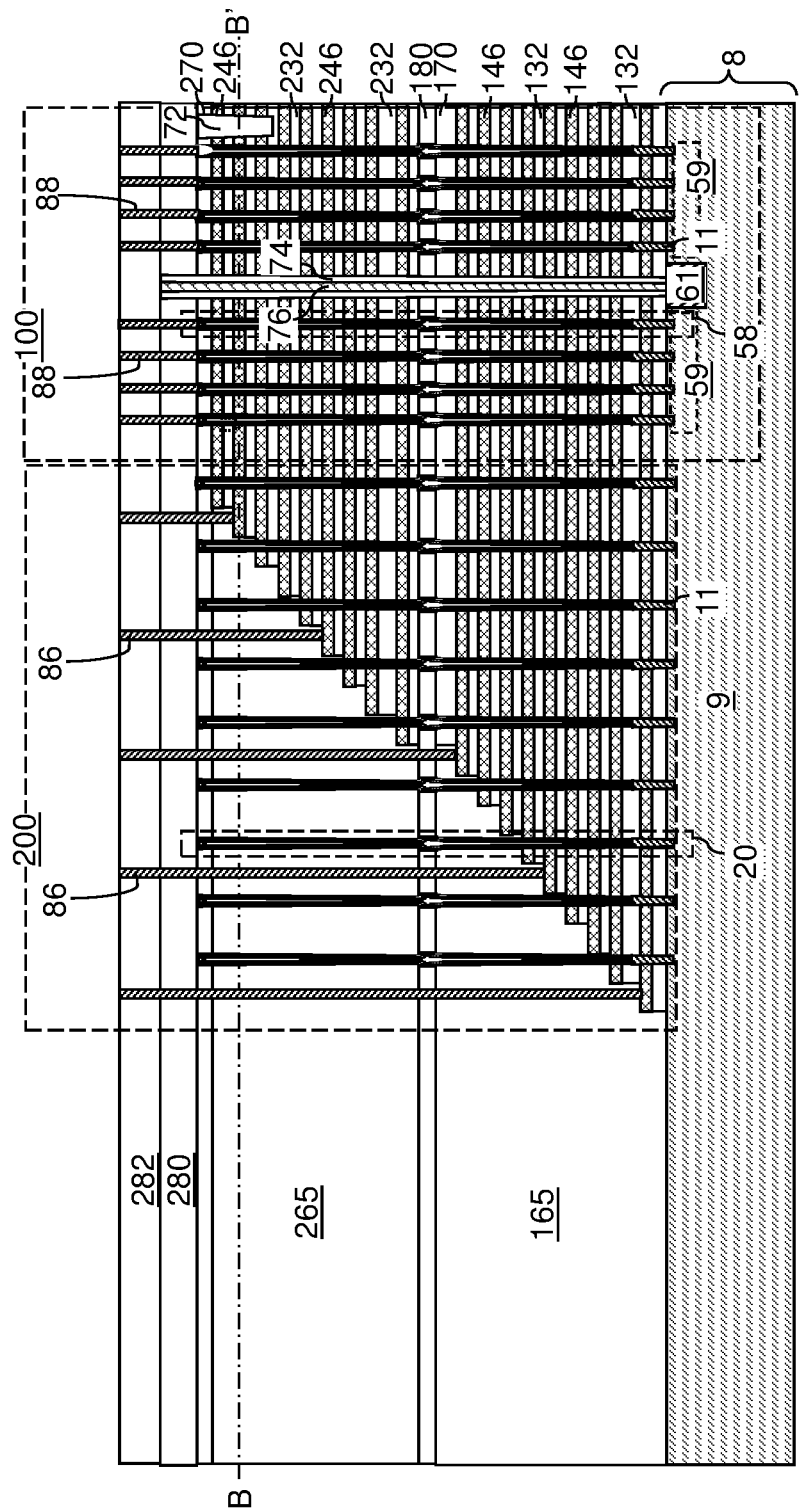

FIG. 15A is a vertical cross-sectional view of the first exemplary structure after formation of drain contact via cavities and word line contact via cavities according to an embodiment of the present disclosure.

Figure 15B:
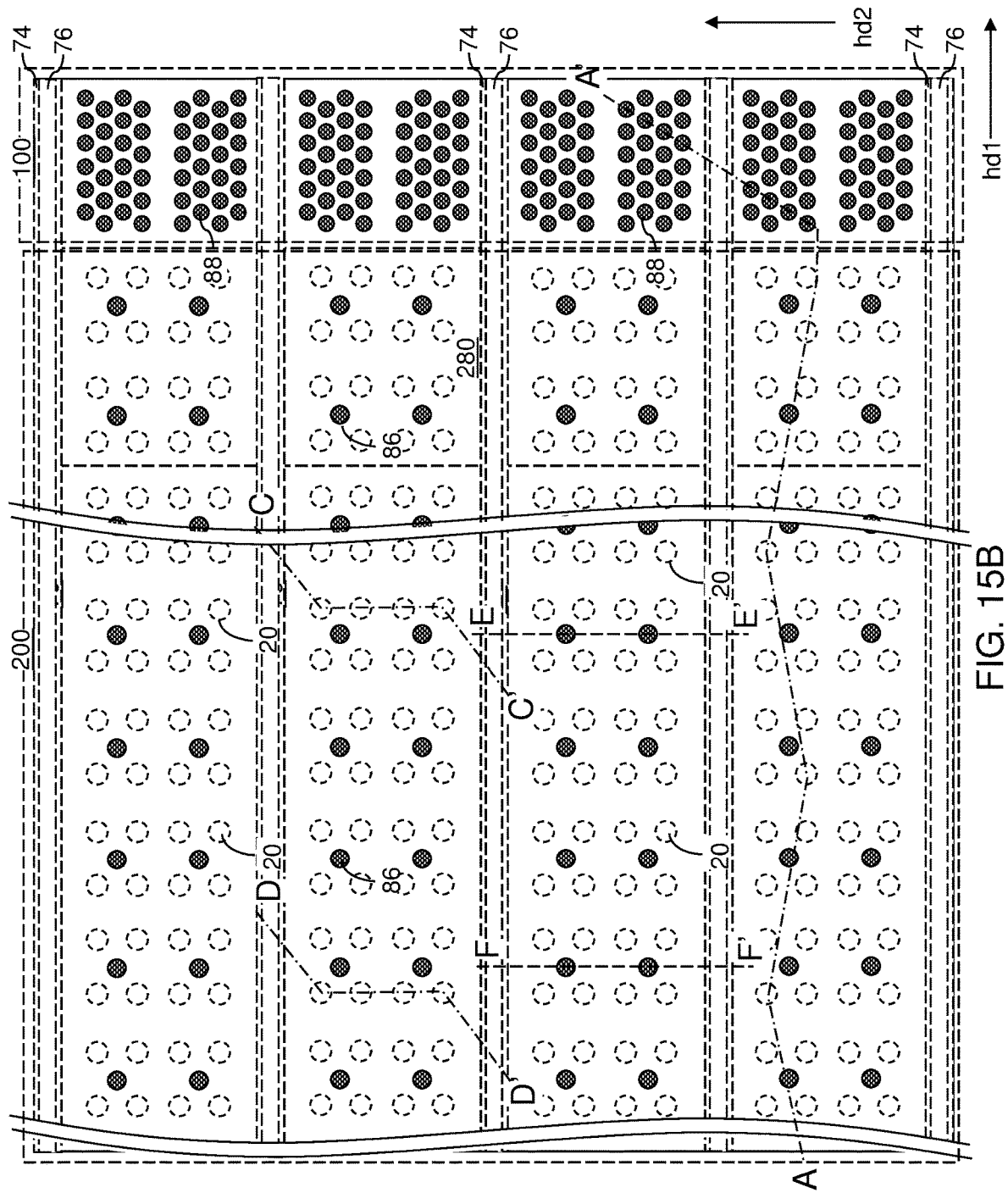

FIG. 15B is a horizontal cross-sectional view of the first exemplary structure along the horizontal plane B-B' in FIG. 15A. The hinged vertical plane A-A' corresponds to the plane of the vertical cross-sectional view of FIG. 15A.

Figure 15C:
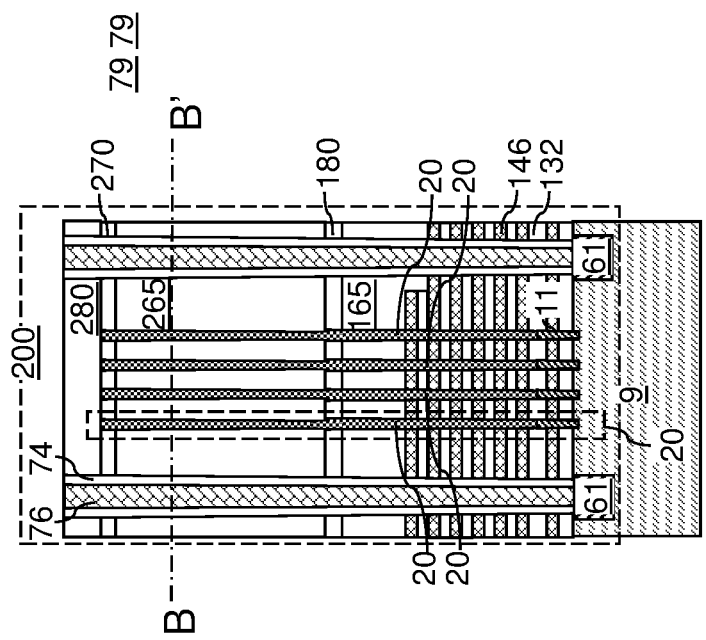

FIG. 15C is a vertical cross-sectional view of the first exemplary structure along the hinged vertical plane C-C' of FIG. 15B.

Figure 15D:
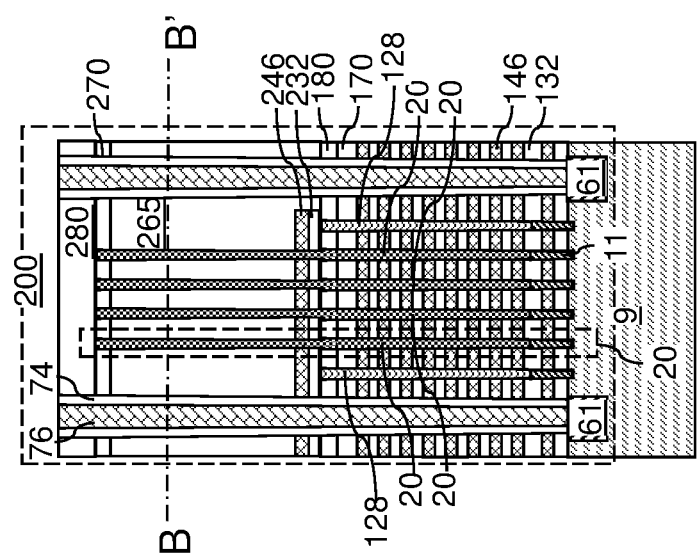

FIG. 15D is a vertical cross-sectional view of the first exemplary structure along the hinged vertical plane D-D' of FIG. 15B.

Figures 15E, 15F:
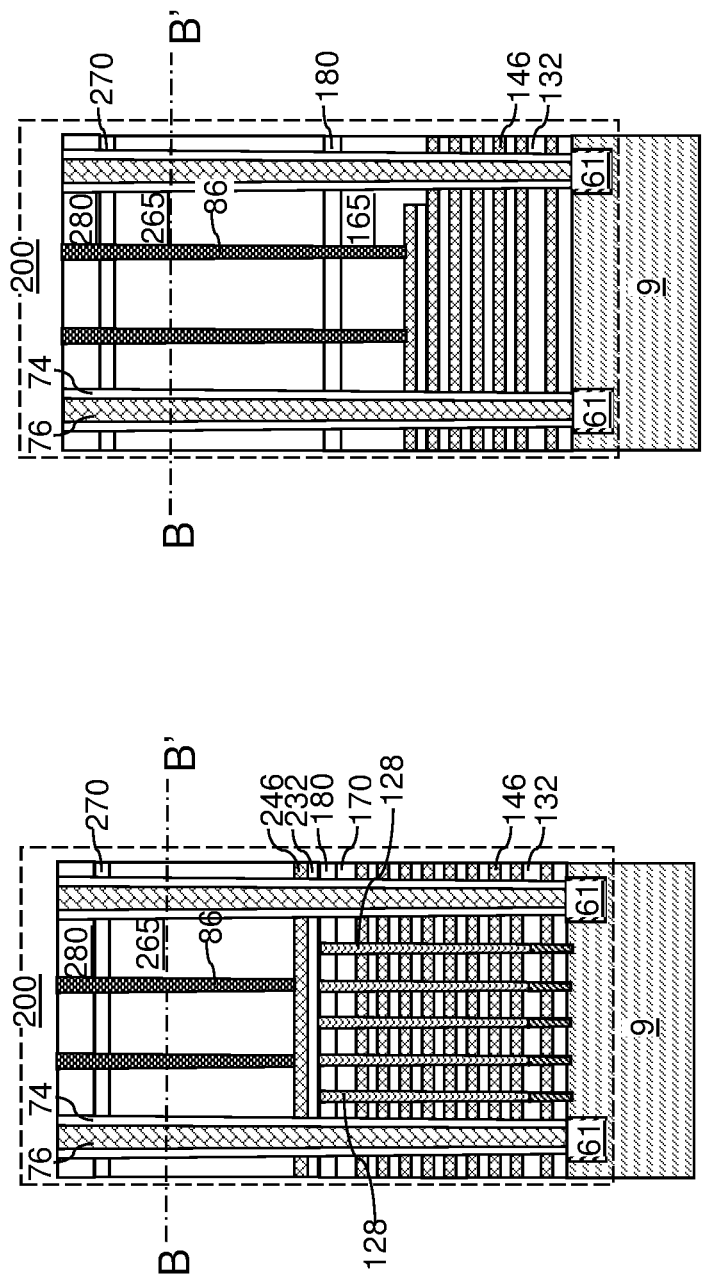

FIG. 15E is a vertical cross-sectional view of the first exemplary structure along the vertical plane E-E' of FIG. 15B.

FIG. 15F is a vertical cross-sectional view of the first exemplary structure along the vertical plane F-F' of FIG. 15B.

Figure 16:
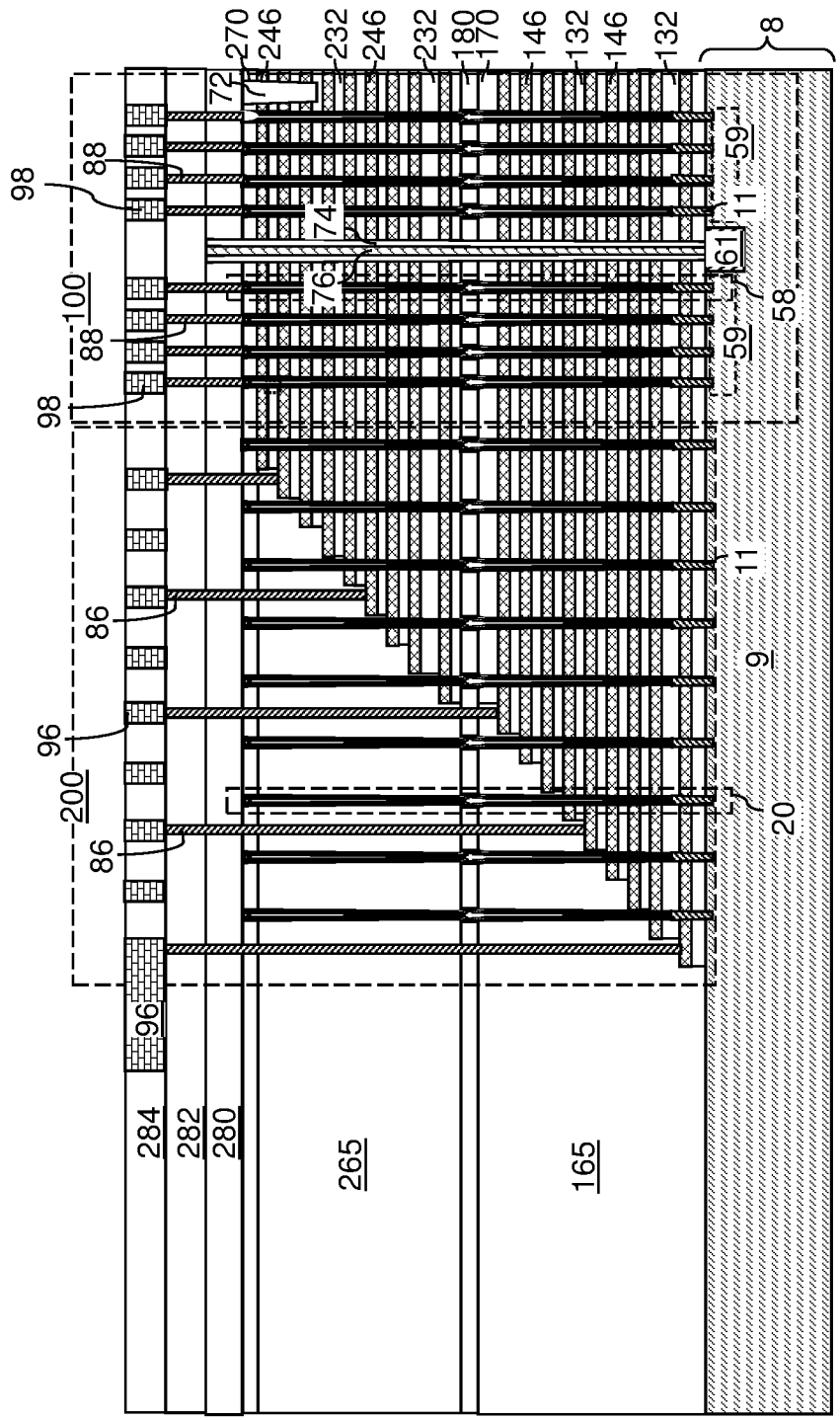

FIG. 16 is a vertical cross-sectional view of the first exemplary structure after formation of bit-line-level metal interconnect structures according to an embodiment of the present disclosure.

Figure 17A:
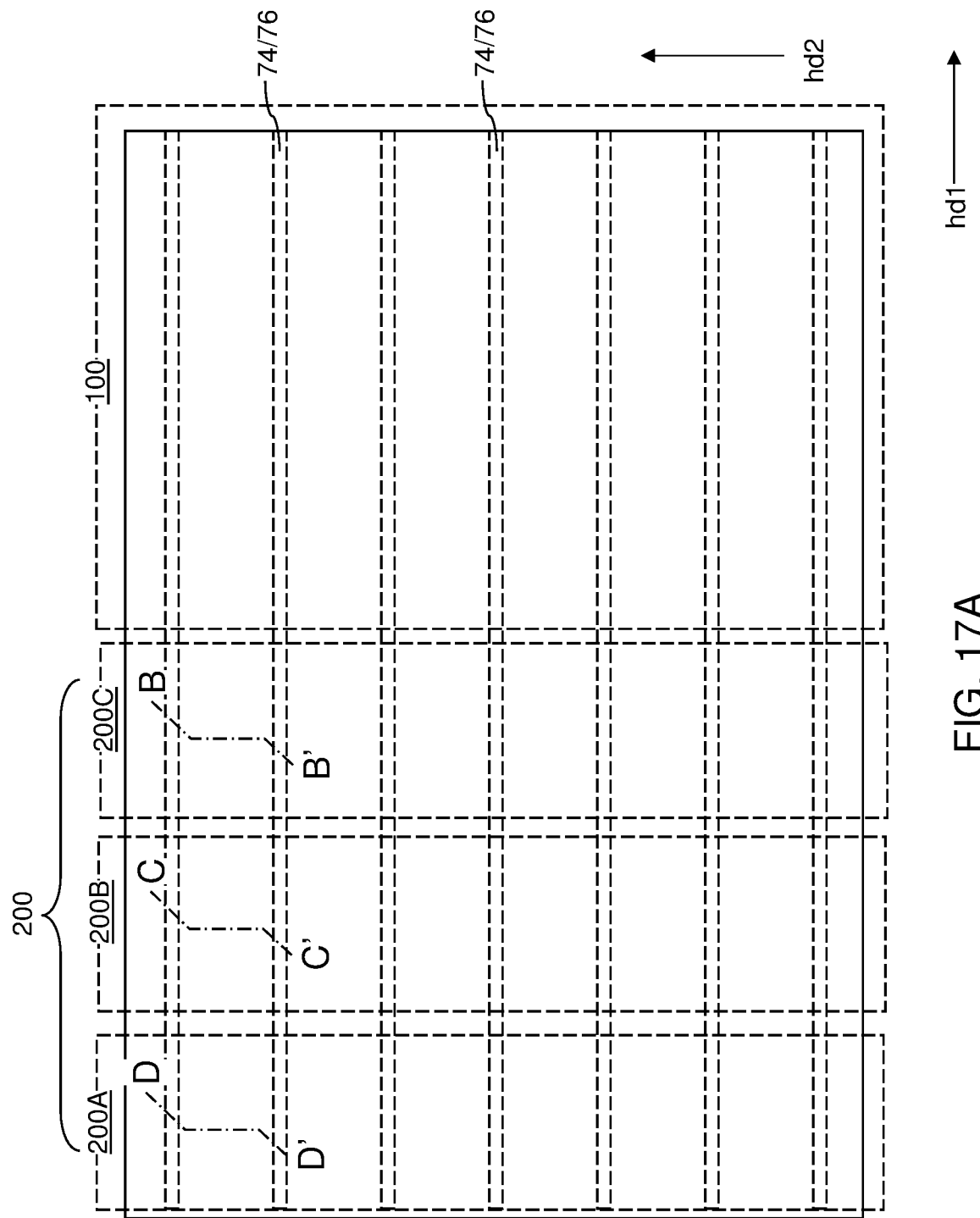

FIG. 17A is a top-down view of a second exemplary structure including a first-tier structure, a second-tier structure, and a third-tier structure according to a second embodiment of the present disclosure.

FIG. 17B is a vertical cross-sectional view of the second exemplary structure along the hinged vertical plane B-B' of FIG. 17A.

FIG. 17C is a vertical cross-sectional view of the second exemplary structure along the hinged vertical plane C-C' of FIG. 17B.

FIG. 17D is a vertical cross-sectional view of the second exemplary structure along the hinged vertical plane D-D' of FIG. 17B.

Figure 18:
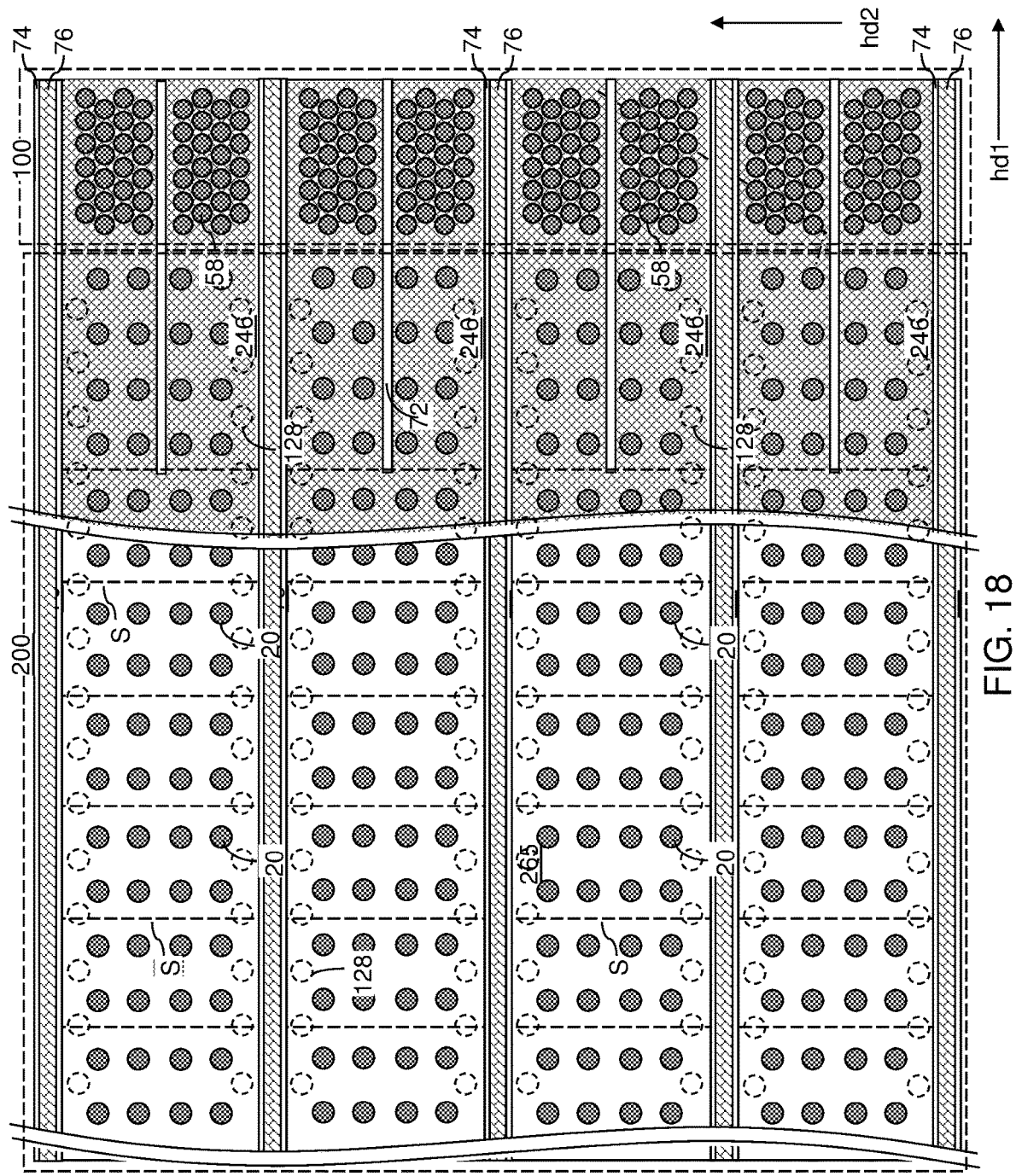

FIG. 18 is a top-down view of the third exemplary structure of the third exemplary structure of the third embodiment of the present disclosure.

Figure 19:
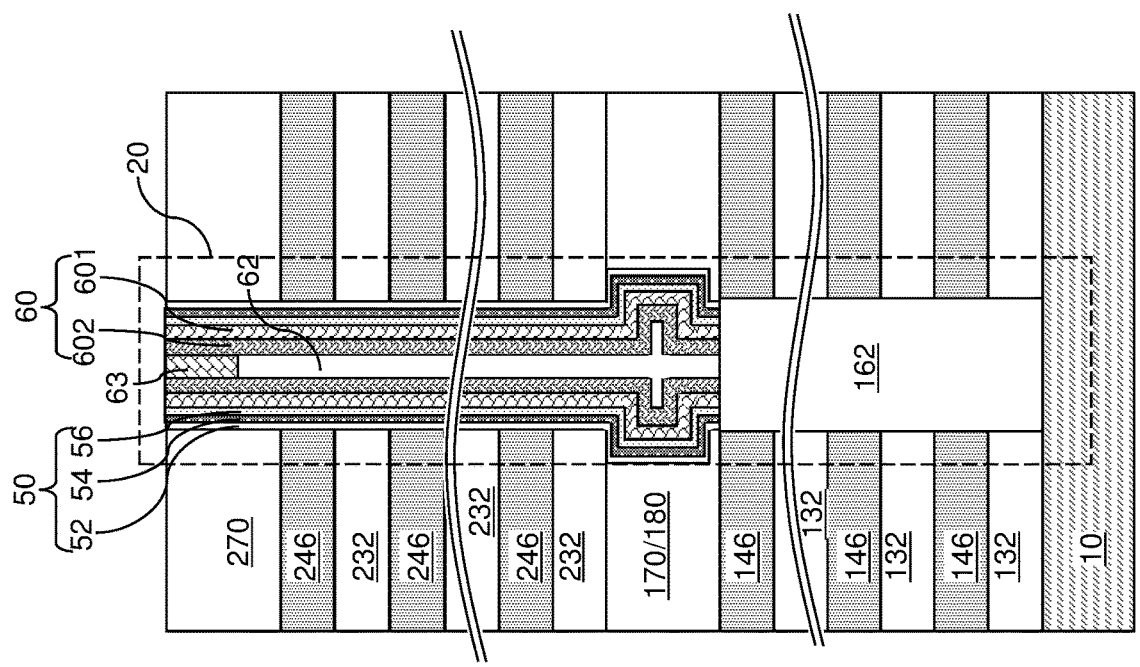

FIG. 19 is a vertical cross-sectional view of a primary support pillar structure of the third exemplary structure of the third embodiment of the present disclosure.

DETAILED DESCRIPTION

As discussed above, the present disclosure is directed to a three-dimensional memory device containing auxiliary support pillar structures and methods of making the same, the various aspects of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Figure 1:
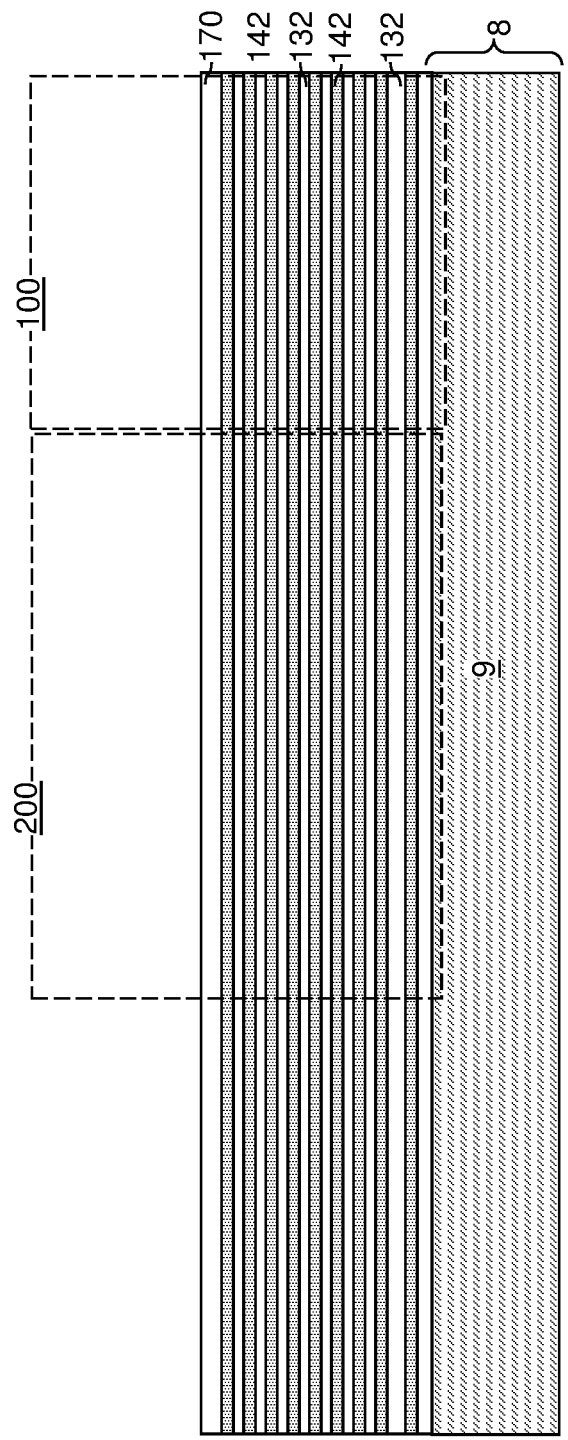
FIG. 1 is a vertical cross-sectional view of a first exemplary structure after formation of a first alternating stack of first insulting layers and first sacrificial material layers according to the first embodiment of the present disclosure.

Referring to FIG. 1, a first exemplary structure according to a first embodiment of the present disclosure is illustrated. The first exemplary structure includes a substrate 8 containing a semiconductor material layer 9 at least at an upper portion thereof. In one embodiment, the semiconductor material layer 9 may be a single crystalline semiconductor material layer or a doped well in a semiconductor substrate, such as a silicon wafer. In another embodiment, the substrate 8 may include a substrate semiconductor layer (not shown) with semiconductor devices (not shown) thereupon, and lower-level dielectric material layers (not shown) embedding lower-level metal interconnect structures (not shown) and located above the semiconductor devices. In this case, the semiconductor material layer 9 may be formed over the lower-level dielectric material layers. The semiconductor material layer 9 may have a doping of a first conductivity type, which may be p-type or n-type. The semiconductor material layer 9 may include a single crystalline semiconductor material or a polycrystalline semiconductor material (such as polysilicon or a polycrystalline silicon-germanium alloy).

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from $1.0$ S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

An alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first alternating stack. The level of the first alternating stack is herein referred to as a first-tier level, and the level of the alternating stack to be subsequently formed immediately above the first-tier level is herein referred to as a second-tier level, etc.

The first alternating stack can include first insulting layers 132 as the first material layers, and first sacrificial material layers 142 as the second material layers. In one embodiment, each first insulating layer 132 can include a first insulating material, and each first sacrificial material layer 142 can include a first sacrificial material. An alternating plurality of first insulating layers 132 and first sacrificial material layers 142 is formed over the semiconductor material layer 9. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the first insulating cap layer 170 can be in a range from 20 nm to 300 nm, although lesser and greater thicknesses can also be employed.

Figure 2:
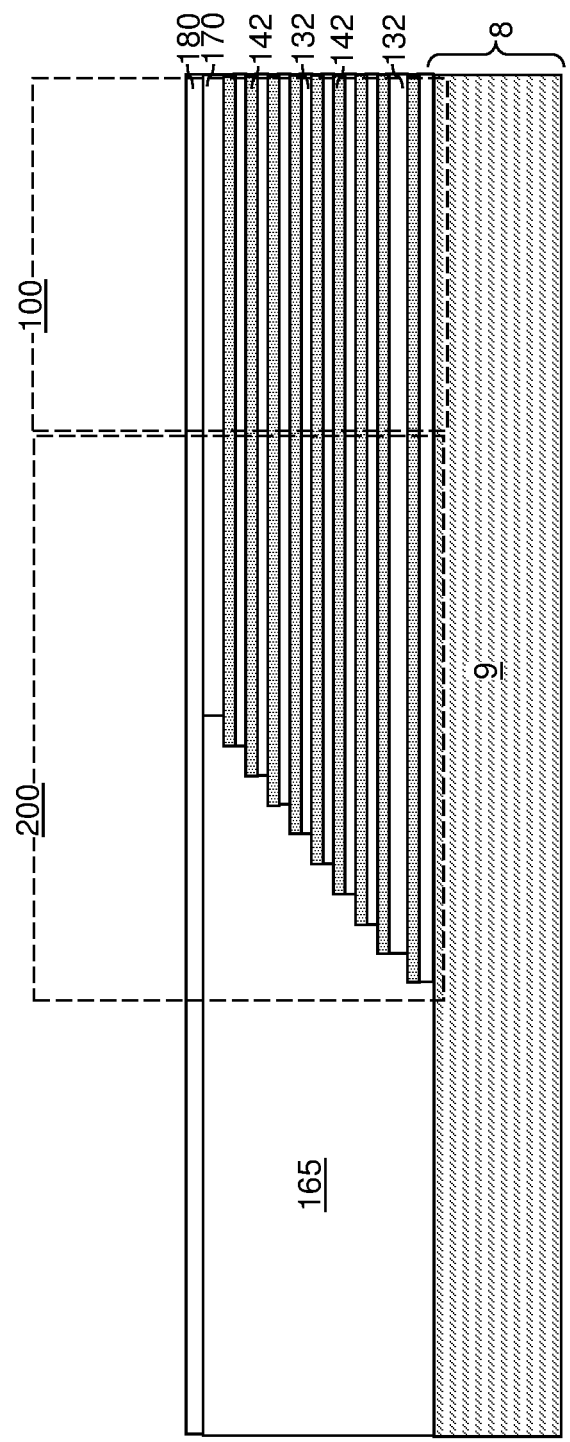
FIG. 2 is a vertical cross-sectional view of the first exemplary structure after patterning of first stepped surfaces on the first alternating stack and formation of a first retro-stepped dielectric material portion according to an embodiment of the present disclosure.

Referring to FIG. 2, the first insulating cap layer 170 and the first alternating stack (132, 142) can be patterned to form first stepped surfaces in the contact region 200. The contact region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. The first stepped surfaces continuously extend from a bottommost layer within the first alternating stack (132, 142) to a topmost layer within the first alternating stack (132, 142). The cavity overlying the first stepped surfaces is herein referred to as a first stepped cavity.

A dielectric material, such as a silicate glass, can be deposited in the first stepped cavity. The dielectric material is subsequently planarized to provide a planar surface within a horizontal plane including a top surface of the first insulating cap layer. A continuous remaining portion of the dielectric material overlying the first stepped surfaces and filling the first stepped cavity is herein referred to as a first retro-stepped dielectric material portion 165, which comprises, and can consist of, the first silicate glass material. As used herein, a "retro-stepped" element refers to an element that has stepped surfaces and a horizontal cross-sectional area that increases monotonically as a function of a vertical distance from a top surface of a substrate on which the element is present. The first alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 165, 170). The inter-tier dielectric layer 180 includes a dielectric material such as a silicate glass material. The thickness of the inter-tier dielectric layer 180 can be in a range from 30 nm to 300 nm, although lesser and greater thicknesses can also be employed. In one embodiment, the inter-tier dielectric layer 180 can include a silicate glass that provides a greater etch rate in hydrofluoric acid than undoped silicate glass. For example, the inter-tier dielectric layer 180 can include borosilicate glass.

The combination of all material portions formed over the top surface of the semiconductor material layer 9 and underneath the inter-tier dielectric layer 180 constitutes a first-tier structure (132, 142, 165). The first-tier structure (132, 142, 165) comprises a first alternating stack of first insulating layers 132 and first sacrificial material layers 142 and a first retro-stepped dielectric material portion 165 overlying, and contacting, first stepped surfaces of the first alternating stack (132, 142). The first stepped surfaces continuously extend from a bottommost layer within the first alternating stack (132, 142) to a topmost layer within the first alternating stack (132, 142) and contacts vertical surfaces and horizontal bottom surfaces of the first retro-stepped dielectric material portion 165.

Referring to FIGS. 3A-3D, first-tier memory openings 149, first-tier support openings 119, and auxiliary support openings 129 can be formed. Locations of steps S in the first alternating stack (132, 142) are illustrated as dotted lines in FIG. 3B. The first-tier memory openings 149, the first-tier support openings 119 and the auxiliary support openings 129 extend through the first alternating stack (132, 142) at least to a top surface of the semiconductor material layer 9. The first-tier memory openings 149 can be formed in the memory array region 100 at locations at which memory stack structures including vertical stacks of memory elements are to be subsequently formed. The first-tier support openings 119 can be formed in the contact region 200. The first-tier support openings 119 can be formed within a first area of the first stepped surfaces at which the first retro-stepped dielectric material portion 165 contacts the first alternating stack (132, 142) and within a second area of the contact region 200 in which second stepped surfaces of a second alternating stack are to be subsequently formed. The second area of the contact region 200 is located between the first area of the word line contact region and the memory array region 100. The auxiliary support openings 129 are formed in the area of the contact region in which the first stepped surfaces are not present. For example, the auxiliary support openings 129 can be formed in the second area of the contact region 200 that is located outside the area (i.e., the first area) in which the first stepped surfaces are present.

For example, a lithographic material stack (not shown) including at least a photoresist layer can be formed over the first insulating cap layer 170 (and the optional inter-tier dielectric layer 180, if present), and can be lithographically patterned to form openings within the lithographic material stack. The pattern in the lithographic material stack can be transferred through the first insulating cap layer 170 (and the optional inter-tier dielectric layer 180), and through the entirety of the first alternating stack (132, 142) by at least one anisotropic etch that employs the patterned lithographic material stack as an etch mask. Portions of the first insulating cap layer 170 (and the optional inter-tier dielectric layer 180), and the first alternating stack (132, 142) underlying the openings in the patterned lithographic material stack are etched to form the first-tier memory openings 149, the first-tier support openings 119, and the auxiliary support openings 129. In other words, the transfer of the pattern in the patterned lithographic material stack through the first insulating cap layer 170 and the first alternating stack (132,

142) forms the first-tier memory openings 149, the first-tier support openings 119, and the auxiliary support openings 129.

In one embodiment, the chemistry of the anisotropic etch process employed to etch through the materials of the first alternating stack (132, 142) can alternate to optimize etching of the first and second materials in the first alternating stack (132, 142). The anisotropic etch can be, for example, a series of reactive ion etches or a single etch (e.g., $CF_4/O_2/Ar$ etch). The sidewalls of the first-tier memory openings 149, the support openings 119, and the auxiliary support openings 129 can be substantially vertical, or can be tapered. Subsequently, the patterned lithographic material stack can be subsequently removed, for example, by ashing.

Optionally, the portions of the first-tier memory openings 149, the first-tier support openings 119, and the auxiliary support openings 129 at the level of the inter-tier dielectric layer 180 can be laterally expanded by an isotropic etch. For example, if the inter-tier dielectric layer 180 comprises a dielectric material (such as borosilicate glass) having a greater etch rate than the first insulating layers 132 (that can include undoped silicate glass), an isotropic etch (such as a wet etch employing HF) can be employed to expand the lateral dimensions of the first-tier memory openings at the level of the inter-tier dielectric layer 180. The portions of the first-tier memory openings 149 (and the first-tier support openings 119 and the auxiliary support openings 129) located at the level of the inter-tier dielectric layer 180 may be optionally widened to provide a larger landing pad for second-tier memory openings to be subsequently formed through a second alternating stack (to be subsequently formed prior to formation of the second-tier memory openings).

Figure 3A:
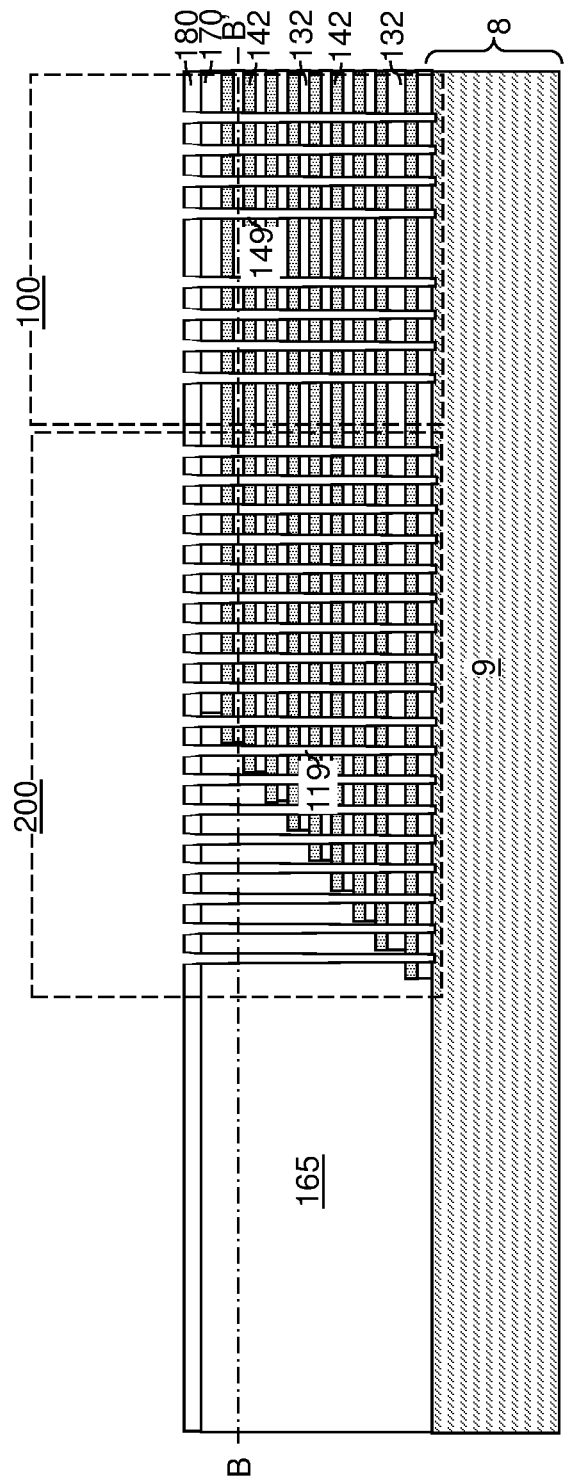
FIG. 3A is a vertical cross-sectional view of the first exemplary structure after formation of first-tier memory openings, first-tier support openings, and auxiliary support openings according to an embodiment of the present disclosure.
Figure 3B:
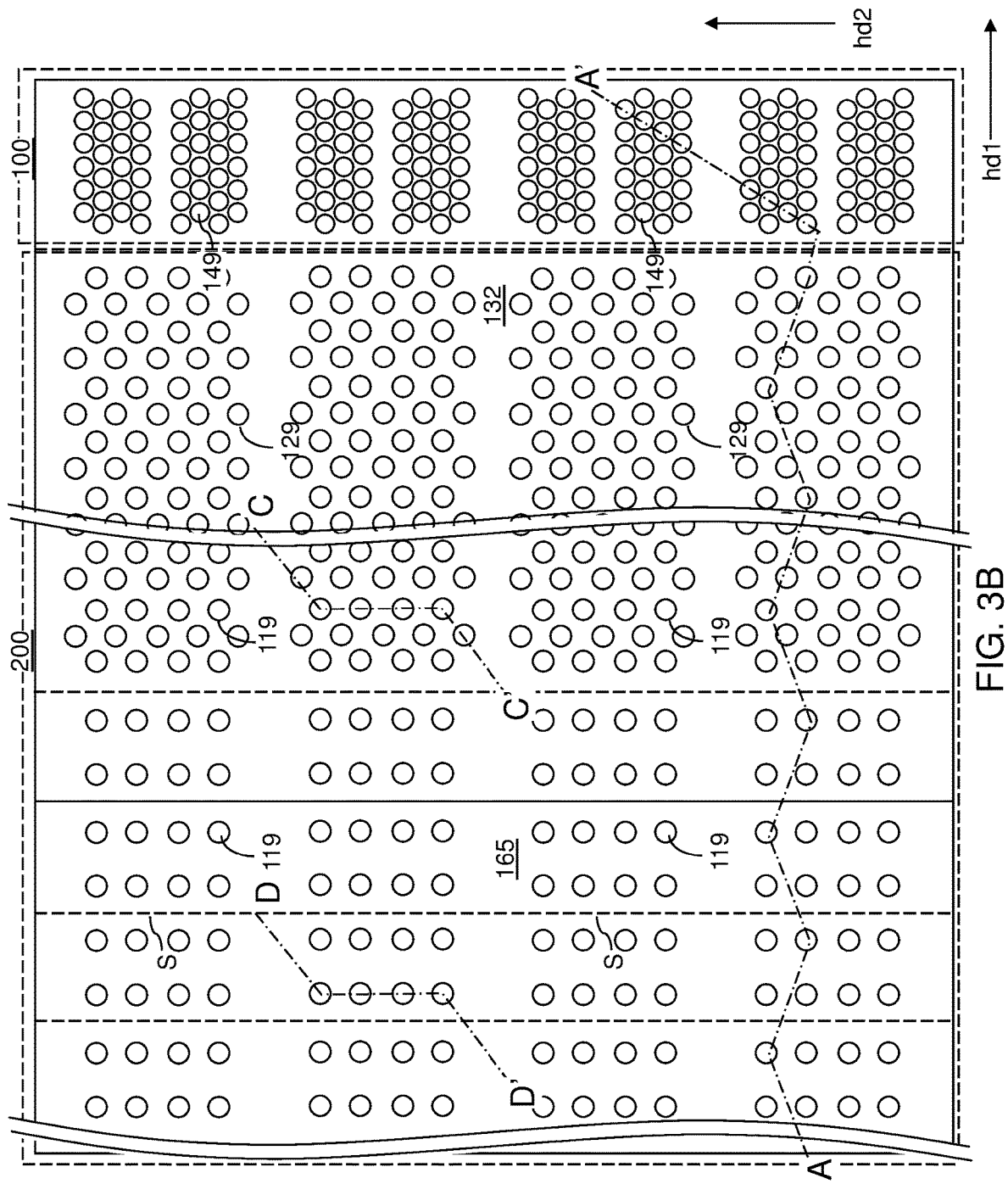
FIG. 3B is a horizontal cross-sectional view of the first exemplary structure along the horizontal plane B-B' in FIG. 3A. The hinged vertical plane A-A' corresponds to the plane of the vertical cross-sectional view of FIG. 3A.
Figure 3D:
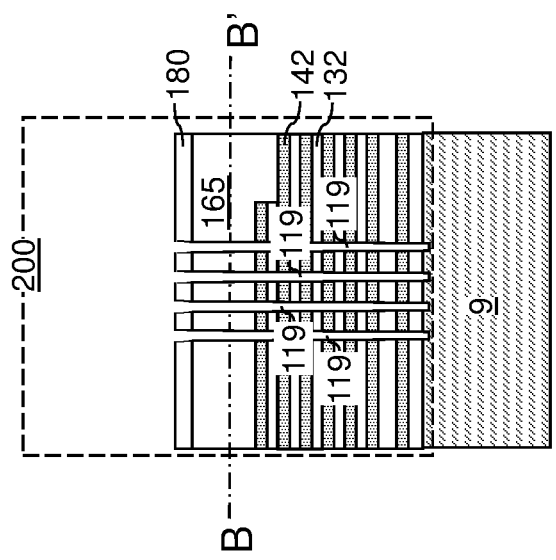
FIG. 3D is a vertical cross-sectional view of the first exemplary structure along the hinged vertical plane D-D' of FIG. 3B.
Figure 3C:
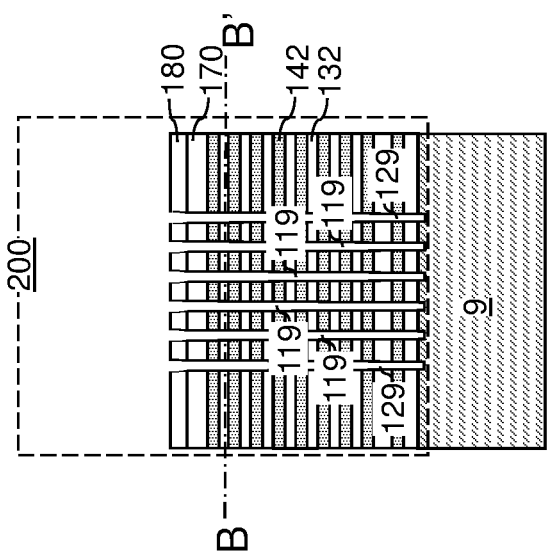
FIG. 3C is a vertical cross-sectional view of the first exemplary structure along the hinged vertical plane C-C' of FIG. 3B.

A first subset of the first-tier support openings 119 can be provided within the second area of the contact region 200 (i.e., in a region located between the first stepped surfaces and the memory array region 100 in which the auxiliary support openings 129 are located). A second subset of the first-tier support openings 119 can be provided within the first area of the contact region 200, i.e., the region including the area of the first stepped surfaces. Thus, there is a higher density of openings (119, 129) in the second area of the contact region 200 than the density of openings (119) in the first area of the contact region 200 because the second area contains the auxiliary support openings 129 in addition to the first subset of the first-tier support openings 119, as shown in FIGS. 3C and 3D, respectively. Each of the first subset of the first-tier support openings 119, the second subset of the first-tier support openings 119, and the auxiliary support openings 129 can be arranged as a respective periodic two-dimensional array having a same first pitch along a first horizontal direction hd1 and having a same second pitch along a second horizontal direction hd2 that is perpendicular to the first horizontal direction hd1. The auxiliary support openings 129 can be laterally offset from the first subset of the first-tier support openings 119 by one half of the second pitch along the second horizontal direction hd2.

Figure 4:
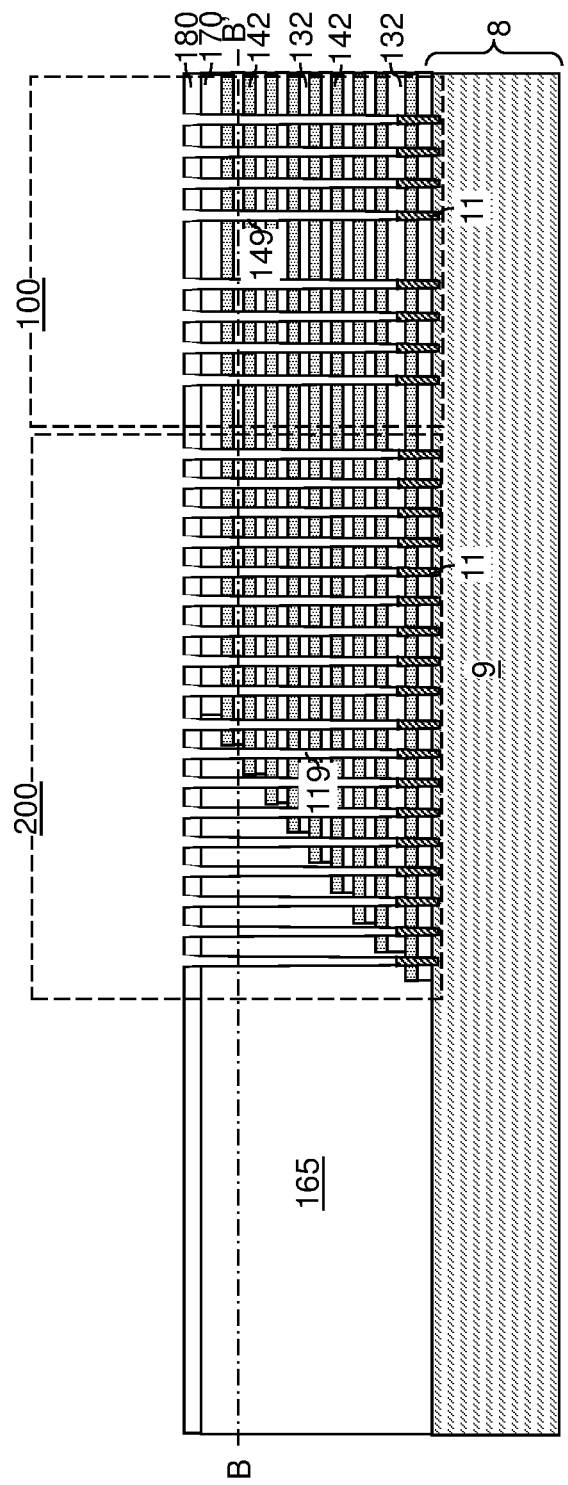
FIG. 4 is a vertical cross-sectional view of the first exemplary structure after formation of an optional pedestal channel portion in each of the first-tier memory openings, first-tier support openings, and auxiliary support openings according to an embodiment of the present disclosure.
Figure 5A:
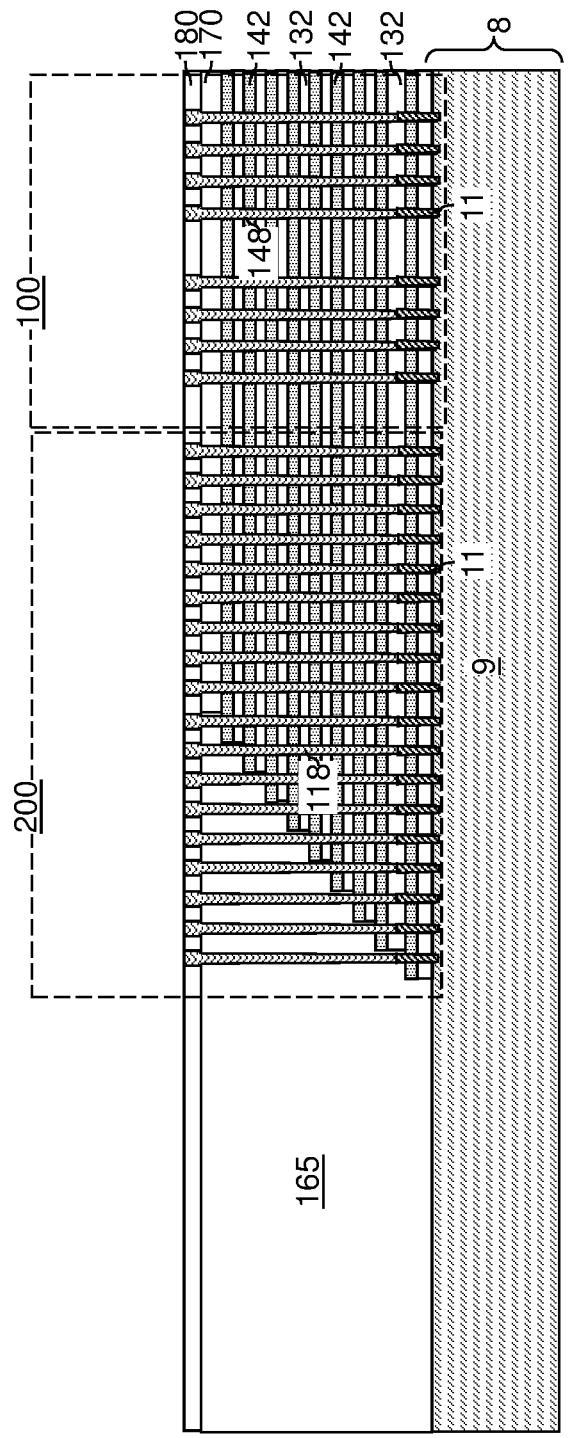
FIG. 5A is a vertical cross-sectional view of the first exemplary structure after formation of first-tier sacrificial memory opening fill structures, first-tier sacrificial support structures, and auxiliary support pillar structures according to an embodiment of the present disclosure.
Figure 5B:
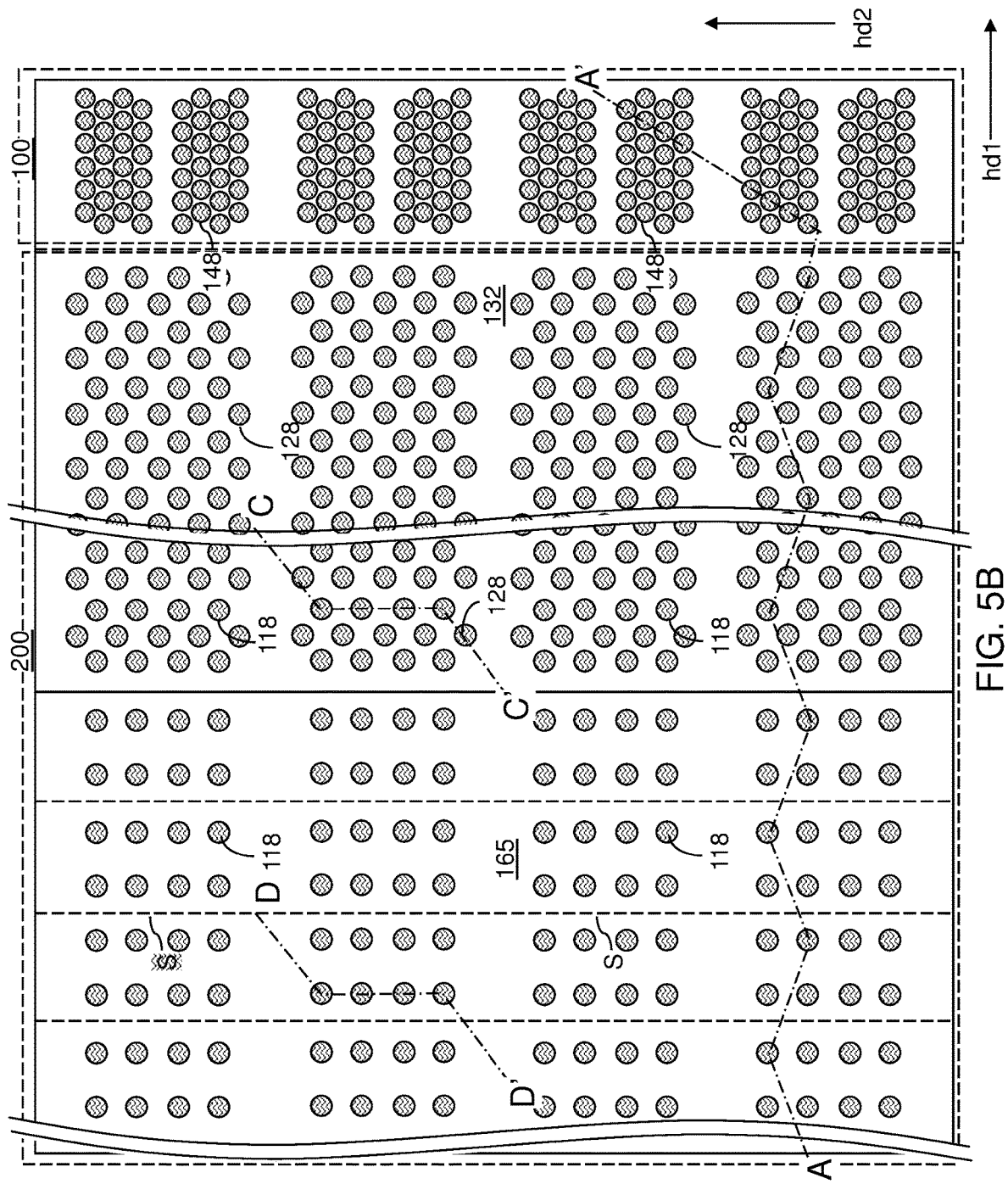
FIG. 5B is a horizontal cross-sectional view of the first exemplary structure along the horizontal plane B-B' in FIG. 5A. The hinged vertical plane A-A' corresponds to the plane of the vertical cross-sectional view of FIG. 5A.
Figure 5C:
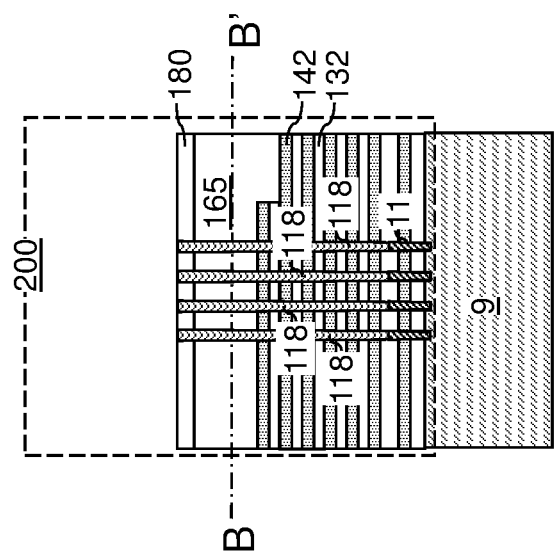
FIG. 5C is a vertical cross-sectional view of the first exemplary structure along the hinged vertical plane C-C' of FIG. 5B.
Figure 5D:
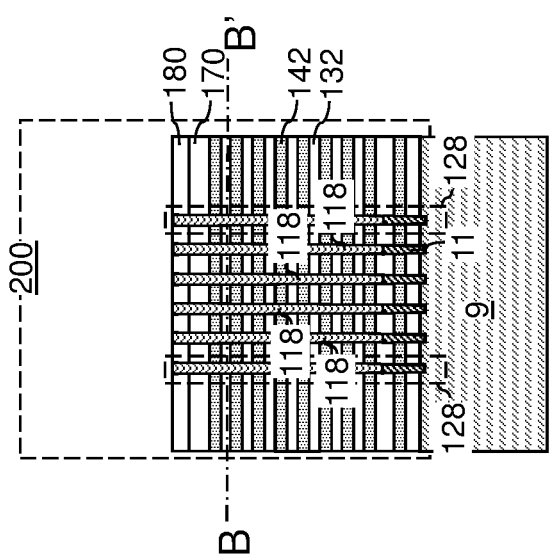
FIG. 5D is a vertical cross-sectional view of the first exemplary structure along the hinged vertical plane D-D' of FIG. 5B.

Referring to FIG. 4, pedestal channel portions 11 may be optionally formed at the bottom of each of the first-tier memory openings 149, the first-tier support openings 119, and the auxiliary support openings 129. The pedestal channel portions 11 may be formed by a selective semiconductor deposition process that deposits a doped semiconductor material having a doping of a first conductivity type. If the pedestal channel portions 11 are formed, top surfaces of the pedestal channel portions 11 can be formed at, or above, the horizontal plane including the top surface of the bottommost first sacrificial material layer 142 and the horizontal plane including the bottom surface of the first sacrificial material layer 42 that is most proximal to the bottommost first sacrificial material layer 142 (i.e., the second-from-the-bottom second sacrificial material layer 142).

Referring to FIGS. 5A-5D, first-tier sacrificial memory opening fill structures 148 can be formed in the first-tier memory openings 149, first-tier sacrificial support structures 118 can be formed in the first-tier support openings 119, and auxiliary support pillar structures 128 can be formed in the auxiliary support openings 129. For example, a fill material layer including a fill material is deposited in the first-tier memory openings 149, the first-tier support openings 119, and the auxiliary support openings 129. The fill material is employed to form auxiliary support pillar structures 128 in the auxiliary support openings 129, and thus, is herein referred to an auxiliary fill material. The auxiliary fill material layer includes a sacrificial material which can be subsequently removed selective to the materials of the first insulating layers 132 and the first sacrificial material layers 142. In one embodiment, the auxiliary fill material layer can include a semiconductor material such as amorphous silicon or polysilicon. In one embodiment, the auxiliary fill material layer can have electrical conductivity less than 10 S/m, such as less than 0.1 S/m. In one embodiment, the auxiliary fill material comprises a semiconductor material that is intrinsic or includes dopants at an atomic concentration less than $1.0 \times 10^{15}/cm^3$, such as less than $1.0 \times 10^{13}/cm^3$. The auxiliary fill material layer may be formed by a conformal deposition method such as low pressure chemical vapor deposition.

Portions of the deposited auxiliary fill material can be removed from above the first insulating cap layer 170 (and the optional inter-tier dielectric layer 180, if present). For example, the auxiliary fill material layer can be recessed to a top surface of the first insulating cap layer 170 (and the optional inter-tier dielectric layer 180) employing a planarization process. The planarization process can include a recess etch, chemical mechanical planarization (CMP), or a combination thereof. The top surface of the first insulating cap layer 170 (and optionally layer 180 if present) can be employed as an etch stop layer or a planarization stop layer. Each remaining portion of the auxiliary fill material in a first-tier memory opening 149 constitutes a first-tier sacrificial memory opening fill structure 148. Each remaining portion of the auxiliary fill material in a first-tier support opening 119 constitutes a first-tier sacrificial support structure 118. Each remaining portion of the auxiliary fill material in an auxiliary support opening 129 constitutes an auxiliary support pillar structure 128. The top surfaces of the first-tier sacrificial memory opening fill structures 148, the first-tier sacrificial support structures 118, and the auxiliary support pillar structures 128 can be coplanar with the top surface of the inter-tier dielectric layer 180 (or the first insulating cap layer 170 if the inter-tier dielectric layer 180 is not present). The first-tier sacrificial memory opening fill structure 148, the first-tier sacrificial support structures 118, and the auxiliary support pillar structures 128 may, or may not, include cavities therein.

The auxiliary support pillar structures 128 are formed through the first-tier structure (132, 142, 165) within the second area of the contact region 200, i.e., within a portion of the contact region 200 that does not have any areal overlay with the first stepped surfaces. The auxiliary support pillar structures 128 vertically extend through each layer within the first alternating stack (132, 142), and underlie a horizontal plane including the top surface of the inter-tier dielectric layer 180. In one embodiment, each of the auxiliary support pillar structures 128 can contact each first insulating layer 132 and each first sacrificial material layer 142 within the first alternating stack (132, 142). In one embodiment, the auxiliary support pillar structures 128 do not contact the first retro-stepped dielectric material portion 165.

In one embodiment, the auxiliary support pillar structures 128 are interlaced with the first subset of the first-tier sacrificial support structures 118 located in the first area of the contact region 200 that does not overlap with the first stepped surfaces. A second subset of the first-tier sacrificial support structures 118 is located in the second area of the contact region 200 that overlaps with the area of the first stepped surfaces, and vertically extend through the first stepped surfaces. The first stepped surfaces do not contact any of the auxiliary support pillar structures 128.

In one embodiment, each of the first subset of the first-tier sacrificial support structures 118, the second subset of the first-tier sacrificial support structures 118, and the auxiliary support pillar structures 128 is arranged as a respective periodic two-dimensional array having the first pitch along the first horizontal direction hd1 and having the second pitch along the second horizontal direction hd2. In one embodiment, the auxiliary support pillar structures 128 are laterally offset from the first subset of the first-tier sacrificial support structures 118 by one half of the second pitch along the second horizontal direction hd1. The first-tier sacrificial support structures 118, the first-tier memory opening fill structures 148, and the auxiliary support pillar structures 128 comprise, and/or consist essentially of, the same auxiliary fill material.

Figure 6:
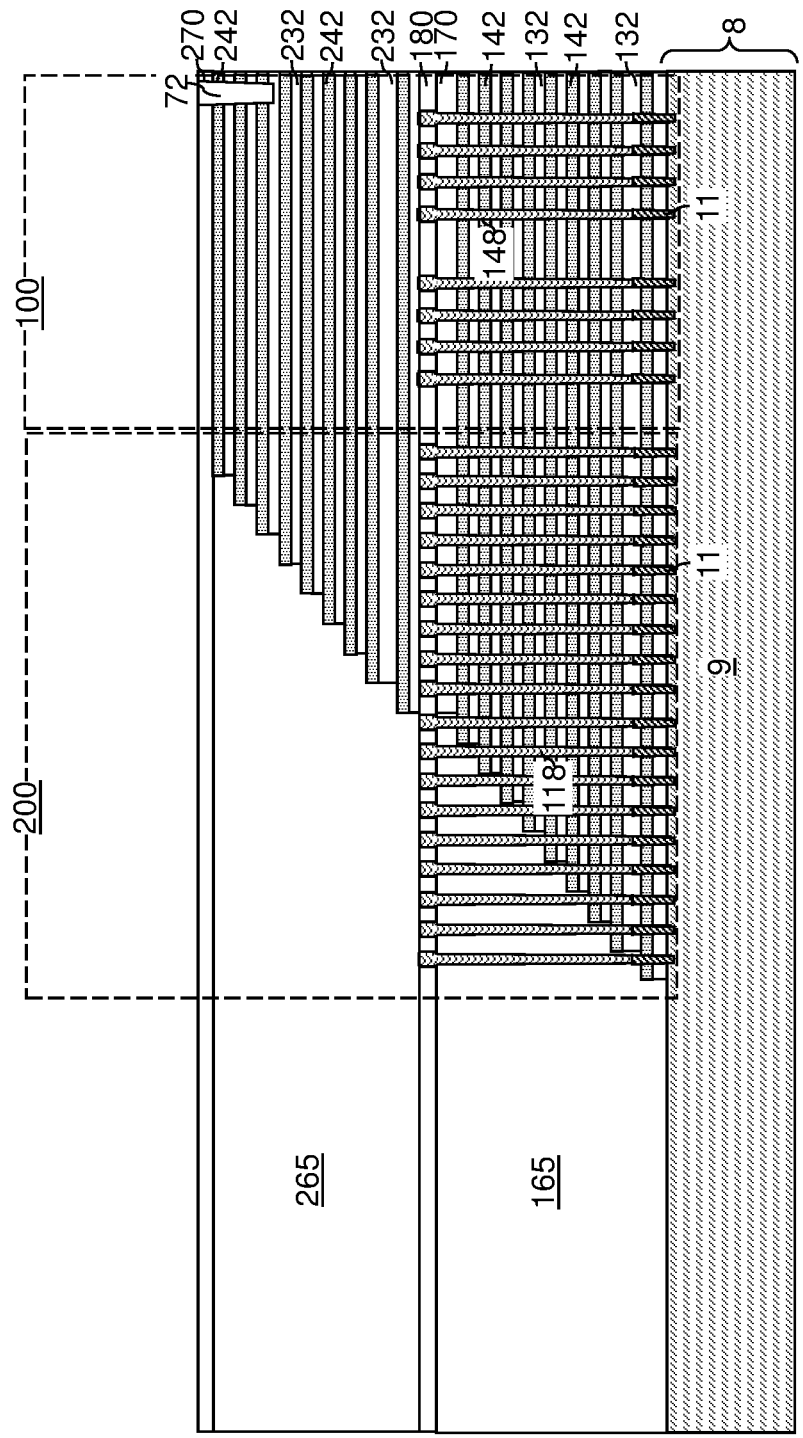
FIG. 6 is a vertical cross-sectional view of the first exemplary structure after formation of a second alternating stack of second insulating layers and second sacrificial material layers, a second-tier retro-stepped dielectric material portion, and a second insulating cap layer according to an embodiment of the present disclosure.

Referring to FIG. 6, a second-tier structure can be formed over the first-tier structure (132, 142, 170, 148, 118). The second-tier structure can include an additional alternating stack of insulating layers and sacrificial material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second sacrificial material layers 242 that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

The second alternating stack (232, 242) can be patterned to form second stepped surfaces in the second stepped area within the contact region 200. The second stepped area is more proximal to the memory array region 100 than the first stepped area including the first stepped surfaces is to the memory array region. The second stepped surfaces can be formed, for example, by forming a mask layer with an opening therein, etching a cavity within a topmost second sacrificial material layer 242 and a topmost second insulating layer 232, and iteratively expanding the etched area and vertically recessing the cavity by etching each pair of a first insulating layer 132 and a first sacrificial material layer 142 located directly underneath the bottom surface of the etched cavity within the etched area. The second stepped surfaces continuously extend from a bottommost layer within the second alternating stack (232, 242) to a topmost layer within the first alternating stack (132, 142). The cavity overlying the second stepped surfaces is herein referred to as a first stepped cavity.

A dielectric material such as silicon oxide can be deposited over the second stepped surfaces. Portions of the dielectric material that overlie the second alternating stack (232, 242) can be removed by a planarization process such as a chemical mechanical planarization (CMP) process. A continuous remaining portion of the dielectric material overlying the second stepped surfaces and filling the second stepped cavity is herein referred to as a second retro-stepped dielectric material portion 265. The second alternating stack (232, 242) and the second retro-stepped dielectric material portion 265 collectively constitute a second-tier structure, which is an in-process structure that is subsequently modified. The second stepped surfaces continuously extend from a bottommost layer within the second alternating stack (232, 242) to a topmost layer within the second alternating stack (232, 242) and contacts vertical surfaces and horizontal bottom surfaces of the second retro-stepped dielectric material portion 265.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide.

Optionally, drain-select-level isolation structures 72 can be formed through a subset of layers in an upper portion of the second alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide.

Referring to FIGS. 7A-7D, second-tier memory openings 249 and second tier support openings 219 extending through the second-tier structure (232, 242, 270, 265) are formed in areas overlying the sacrificial memory opening fill portions 148. A photoresist layer can be applied over the second-tier structure (232, 242, 270, 265), and can be lithographically patterned to form a same pattern as the pattern of the sacrificial memory opening fill portions 148 and the first-tier sacrificial support structures 118, i.e., the pattern of the first-tier memory openings 149 and the first-tier support openings 119. However, no openings are formed over the auxiliary support pillar structures 128. An anisotropic etch can be performed to transfer the pattern of the lithographically patterned photoresist layer through the second-tier structure (232, 242, 270, 265). In one embodiment, the chemistry of the anisotropic etch process employed to etch through the materials of the second alternating stack (232, 242) can alternate to optimize etching of the alternating material layers in the second alternating stack (232, 242). The anisotropic etch can be, for example, a series of reactive ion etches. The patterned lithographic material stack can be removed, for example, by ashing after the anisotropic etch process.

A top surface of an underlying sacrificial memory opening fill portion 148 can be physically exposed at the bottom of each second-tier memory opening 249. A top surface of an underlying first-tier sacrificial support structure 118 can be physically exposed at the bottom of each second-tier support opening 219. However, the top surface of the auxiliary support pillar structures 128 remains covered by the second alternating stack (232, 242).

Referring to FIGS. 8A-8D, an etch process can be performed after the top surfaces of the sacrificial memory opening fill portions 148 and the first-tier sacrificial support structures 118 are physically exposed. The etch process removes the sacrificial material of the sacrificial memory opening fill portions 148 and the first-tier sacrificial support structures 118 selective to the materials of the second alternating stack (232, 242) and the first alternating stack (132, 142) (e.g., $C_4F_8/O_2$/Ar etch). The etch process may include an anisotropic etch process or an isotropic etch process. In one embodiment, the auxiliary fill material of the sacrificial memory opening fill portions 148 and the first-tier sacrificial support structures 118 can include amorphous silicon, and the etch process can include a wet etch process using hot trimethyl-2 hydroxyethyl ammonium hydroxide ("hot TMY") or tetramethyl ammonium hydroxide (TMAH).

Upon removal of the sacrificial memory opening fill portions 148, each vertically adjoining pair of a second-tier memory opening 249 and a first-tier memory opening 149 forms a continuous cavity that extends through the first alternating stack (132, 142) and the second alternating stack (232, 242), which is herein referred to as an inter-tier memory opening 49, or a memory opening 49. Likewise, upon removal of the first-tier sacrificial support structures 118, each vertically adjoining pair of a second-tier support opening 219 and a first-tier support opening 119 forms a continuous cavity that extends through the first alternating stack (132, 142) and the second alternating stack (232, 242), which is herein referred to as an inter-tier support opening 19, or a support opening 19. A top surface of the semiconductor material layer 9 can be physically exposed at the bottom of each memory opening and at the bottom of each support openings. Locations of steps S in the first alternating stack (132, 142) and the second alternating stack (232, 242) are illustrated as dotted lines. The auxiliary support pillar structures 128 are not removed.

FIGS. 9A-9H provide sequential cross-sectional views of a memory opening 49 or a support opening 19 during formation of a memory opening fill structure 58 or a primary support pillar structure 20. While a structural change in a memory opening 49 is illustrated in FIGS. 9A-9H, it is understood that the same structural change occurs in each memory openings 49 and in each of the support openings 19 during the same set of processing steps.

Referring to FIG. 9A, a memory opening 49 in the exemplary device structure of FIG. 14 is illustrated. The memory opening 49 extends through the first-tier structure and the second-tier structure. Likewise, each support opening 19 extends through the first-tier structure and the second-tier structure. A pedestal channel portion 11 may, or may not, be present within each memory opening 49 and within each support opening 19. A cavity 49' is present in the unfilled portion of the memory opening 49 (or of the support opening) above the pedestal channel portion 11.

Referring to FIG. 9B, a stack of layers including a blocking dielectric layer 52, a charge storage layer 54, and a tunneling dielectric layer 56 can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen.

In one embodiment, the blocking dielectric layer 52 can include a dielectric metal oxide having a dielectric constant greater than 7.9, i.e., having a dielectric constant greater than the dielectric constant of silicon nitride. Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof.

The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric silicon compound, such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof.

The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

Figure 9C:
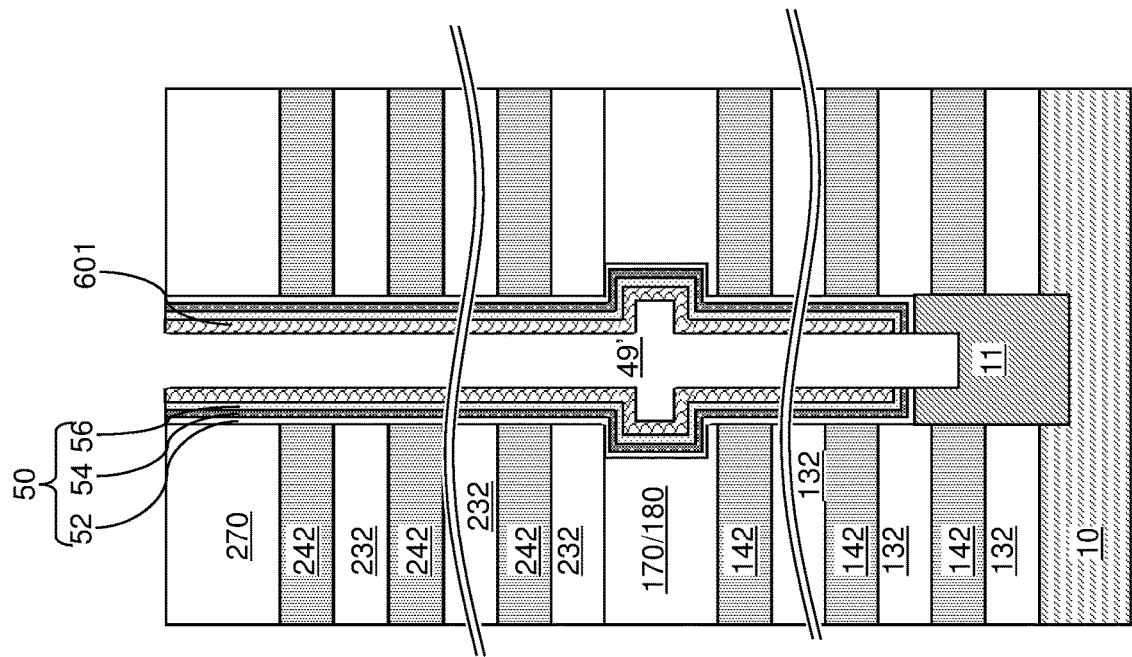

Referring to FIG. 9C, an optional first semiconductor channel layer 601 can be deposited by a conformal deposition process. The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Figure 9D:
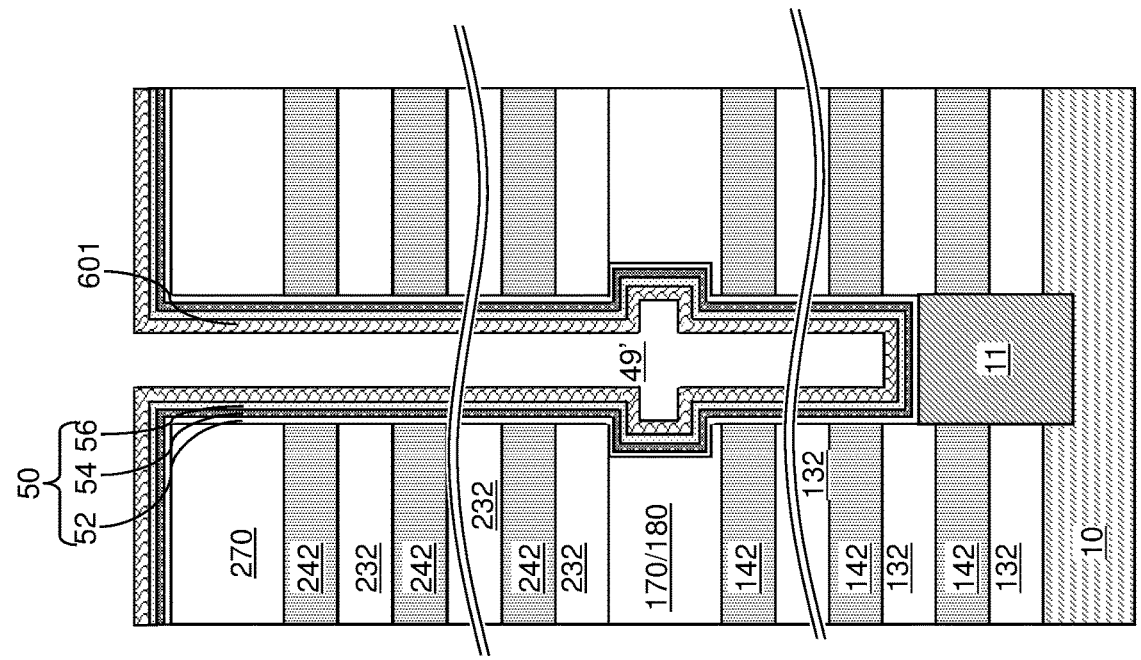

Referring to FIG. 9D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the second insulating cap layer 270 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers (142, 242) constitutes a charge storage region.

A surface of the pedestal channel portion 11 (or a surface of the semiconductor material layer 9 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 9F:
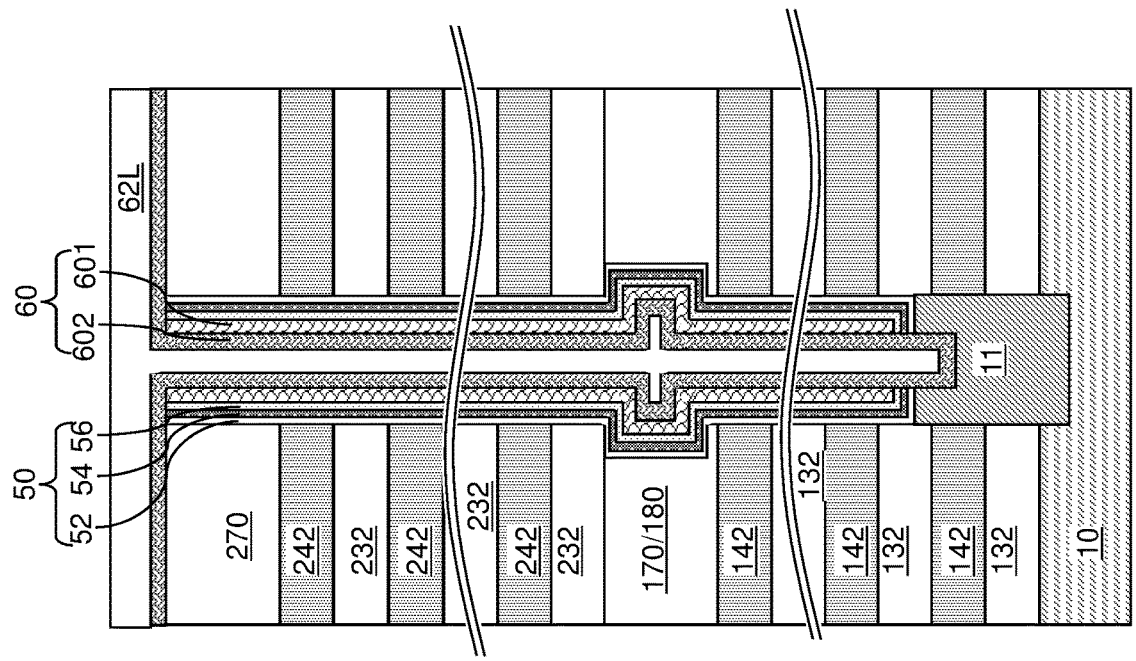
Figure 9E:
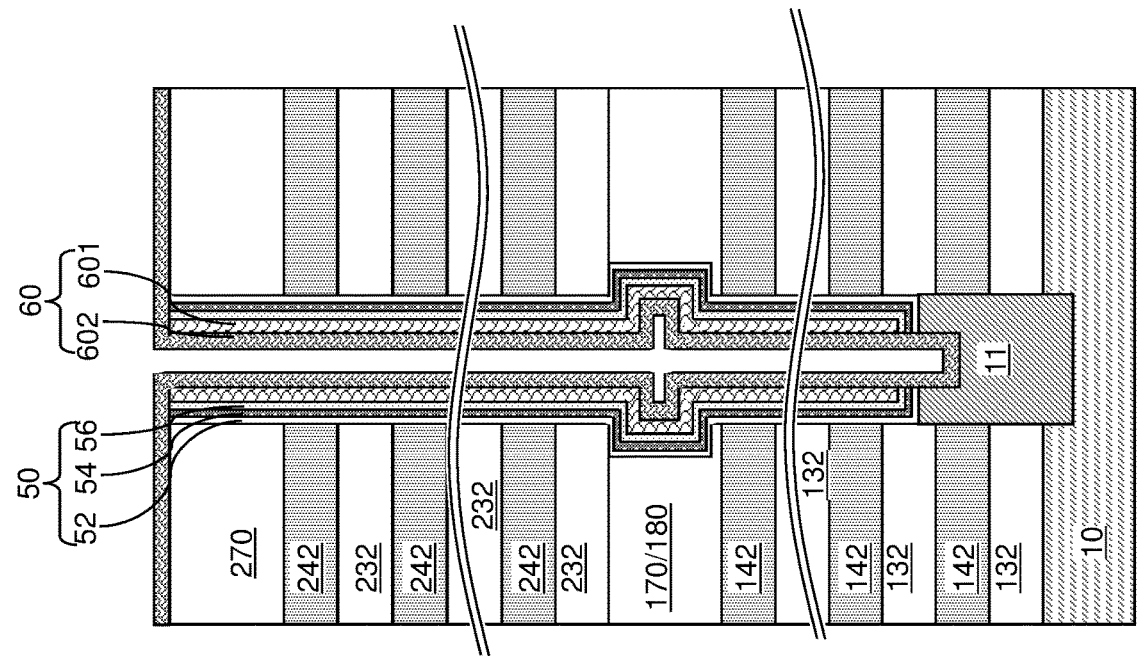

Referring to FIG. 9E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 9F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 9H:
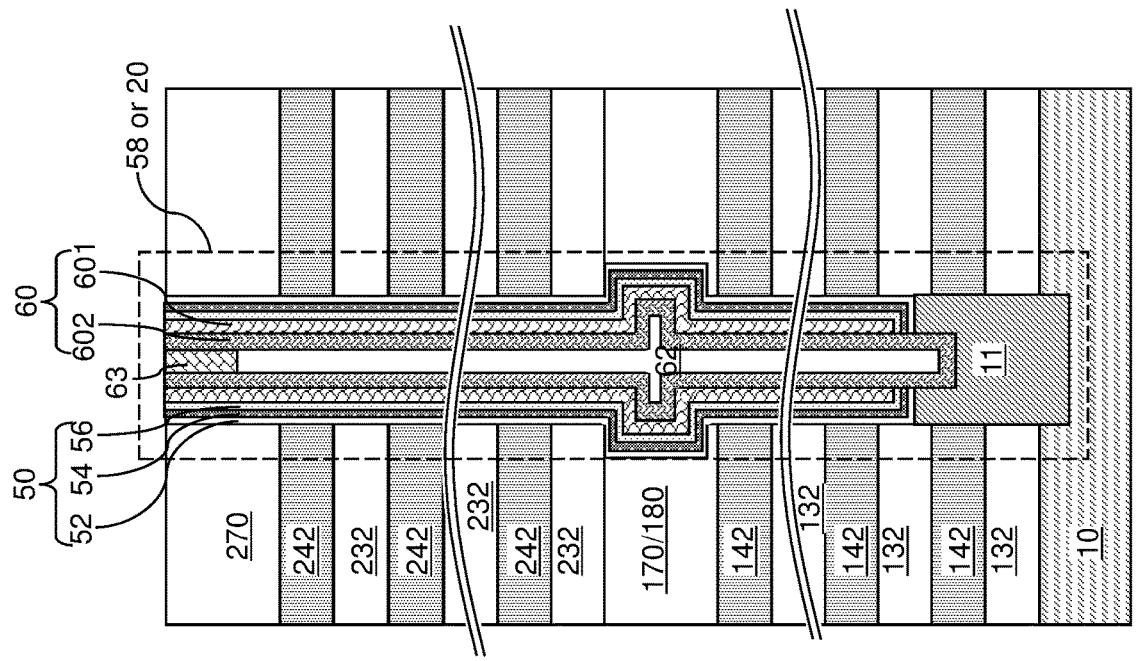
Figure 9G:
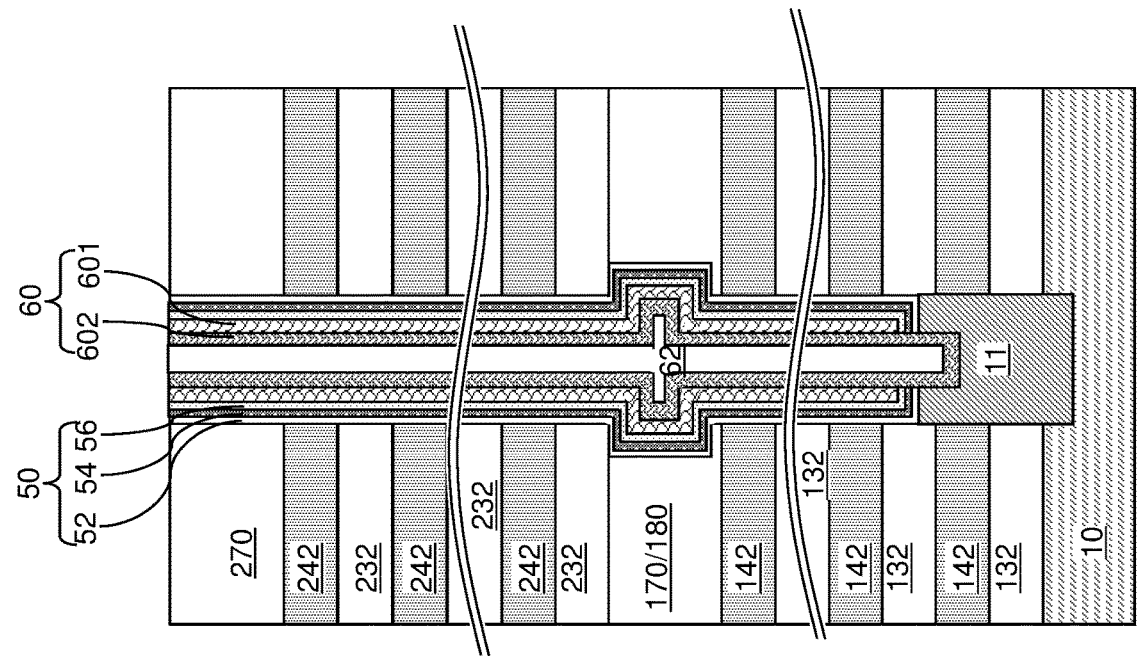

Referring to FIG. 9G, the horizontal portion of the dielectric core layer 62L can be removed, for example, by a recess etch from above the top surface of the second insulating cap layer 270. Each remaining portion of the dielectric core layer 62L constitutes a dielectric core 62. Further, the horizontal portion of the second semiconductor channel layer 602 located above the top surface of the second insulating cap layer 270 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 9H, the top surface of each dielectric core 62 can be further recessed within each memory opening, for example, by a recess etch to a depth that is located between the top surface of the second insulating cap layer 270 and the bottom surface of the second insulating cap layer 270. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{18}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 constitutes a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a primary support pillar structure 20.

The first-tier structure (132, 142, 170, 165), the second-tier structure (232, 242, 270, 265), the inter-tier dielectric layer 180, the memory opening fill structures 58, and the primary support pillar structures 20 collectively constitute a memory-level assembly. The memory-level assembly is formed over the semiconductor material layer 9 such that the semiconductor material layer 9 includes horizontal semiconductor channels electrically connected to vertical semiconductor channels 60 within the memory stack structures 55.

Referring to FIGS. 10A-10D, the first exemplary structure is illustrated after formation of a memory opening fill structure 58 within each memory opening 49 and formation of a primary support pillar structure 20 within each support opening 19.

Referring to FIGS. 11A-11D, a first contact-level dielectric layer 280 can be formed over the memory-level assembly. The first contact-level dielectric layer 280 is formed at a contact level through which various contact via structures are subsequently formed to the drain regions 63 and the various electrically conductive layers that replaces the sacrificial material layers (142, 242) in subsequent processing steps.

Backside trenches 79 are subsequently formed through the first contact-level dielectric layer 280 and the memory-level assembly. For example, a photoresist layer can be applied and lithographically patterned over the first contact-level dielectric layer 280 to form elongated openings that extend along a first horizontal direction hd1. An anisotropic etch is performed to transfer the pattern in the patterned photoresist layer through the first contact-level dielectric layer 280 and the memory-level assembly to a top surface of the semiconductor material layer 9. The photoresist layer can be subsequently removed, for example, by ashing.

The backside trenches 79 extend along the first horizontal direction hd1, and thus, are elongated along the first horizontal direction hd1. The backside trenches 79 can be laterally spaced among one another along a second horizontal direction hd2, which can be perpendicular to the first horizontal direction hd1. The backside trenches 79 can extend through the memory array region (e.g., a memory plane) 100 and the contact region 200. The first subset of the backside trenches 79 laterally divides the memory-level assembly (e.g., into memory blocks).

Dopants of a second conductivity type, which is the opposite of the first conductivity type of the semiconductor material layer 9, can be implanted into a surface portion of the semiconductor material layer 9 to form a source region 61 underneath the bottom surface of each backside trench 79.

Referring to FIGS. 12A-12D, an etchant that selectively etches the materials of the first and second sacrificial material layers (142, 242) with respect to the materials of the first and second insulating layers (132, 232), the first and second insulating cap layers (170, 270), and the material of the outermost layer of the memory films 50 can be introduced into the backside trenches 79, for example, employing an isotropic etch process. First backside recesses 143 are formed in volumes from which the first sacrificial material layers 142 are removed. Second backside recesses 243 are formed in volumes from which the second sacrificial material layers 242 are removed. In one embodiment, the first and second sacrificial material layers (142, 242) can include silicon nitride, and the materials of the first and second insulating layers (132, 232), can be silicon oxide. In another embodiment, the first and second sacrificial material layers (142, 242) can include a semiconductor material such as germanium or a silicon-germanium alloy, and the materials of the first and second insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the backside trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess. A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate, which may be a top surface of the semiconductor material layer 9. A backside recess (143, 243) can be vertically bounded by a top surface of an underlying insulating layer (132 or 232) and a bottom surface of an overlying insulating layer (132 or 232). In one embodiment, each of the first and second backside recesses can have a uniform height throughout.

In one embodiment, a sidewall surface of each pedestal channel portion 11 can be physically exposed at each bottommost first backside recess after removal of the first and second sacrificial material layers (142, 242). Further, a top surface of the semiconductor material layer 9 can be physically exposed at the bottom of each backside trench 79. An annular dielectric spacer 116 can be formed around each pedestal channel portion 11 by oxidation of a physically exposed peripheral portion of the pedestal channel portions 11. Further, a semiconductor oxide potion (not shown) can be formed from each physically exposed surface portion of the semiconductor material layer 9 concurrently with formation of the annular dielectric spacers.

Referring to FIGS. 13A-13D, a backside blocking dielectric layer (not shown) can be optionally deposited in the backside recesses and the backside trenches 79 and over the first contact-level dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses, on the sidewalls of the backside trench 79, and over the first contact-level dielectric layer 280. The at least one conductive material can include at least one metallic material, i.e., an electrically conductive material that includes at least one metallic element.

A plurality of first electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside trench 79 and over the first contact-level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside trenches 79. Specifically, the deposited metallic material of the continuous metallic material layer can be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level isolation structures 72 constitutes drain select gate electrodes. A subset of the first electrically conductive layers 146 located at each level of the annular dielectric spacers (not shown) constitutes source select gate electrodes. A subset of the electrically conductive layer (146, 246) located between the drain select gate electrodes and the source select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the semiconductor material layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Referring to FIGS. 14A-14D, a conformal insulating material layer can be deposited in the backside trenches 79, and can be anisotropically etched to form insulating spacers 74. The insulating spacers 74 include an insulating material such as silicon oxide, silicon nitride, and/or a dielectric metal oxide. A cavity laterally extending along the first horizontal direction hd1 is present within each insulating spacer 74.

A backside contact via structure 76 can be formed in the remaining volume of each backside trench 79, for example, by deposition of at least one conductive material and removal of excess portions of the deposited at least one conductive material from above a horizontal plane including the top surface of the first contact-level dielectric layer 280 by a planarization process such as chemical mechanical planarization or a recess etch. The backside contact via structure 76 are electrically insulated in all lateral directions, and are laterally elongated along the first horizontal direction hd1. As such, the backside contact via structure 76 are laterally elongated along the first horizontal direction hd1. As used herein, a structure is "laterally elongated" if the maximum lateral dimension of the structure along a first horizontal direction is greater than the maximum lateral dimension of the structure along a second horizontal direction that is perpendicular to the first horizontal direction at least by a factor of 5. Each contiguous combination of an insulating spacer 74 and a backside contact via structure 76 constitutes a backside trench fill structure (74, 76) that fills a respective one of the backside trenches 79.

Referring to FIGS. 15A-15F, a second contact-level dielectric layer 282 can be optionally formed over the first contact-level dielectric layer 280. The second contact-level dielectric layer 282 includes a dielectric material such as silicon oxide or silicon nitride. The thickness of the second contact-level dielectric layer 282 can be in a range from 30 nm to 300 nm, although lesser and greater thicknesses can also be employed.

A photoresist layer (not shown) can be applied over the second contact-level dielectric layer 282, and can be lithographically patterned to form openings at locations at which various contact via structures are to be subsequently formed. The openings in the photoresist layer include word line contact openings that overlie horizontal surfaces of the first and second stepped surfaces in the contact region 200. Further, the openings in the photoresist layer include drain contact openings that overlie top surfaces of the memory stack structures 55.

A reactive ion etch process is performed to transfer the pattern of the openings in the photoresist layer through underlying dielectric material layers. Contact via cavities are formed through underlying dielectric material portions (282, 280, 270, 265, 165). The contact via cavities include drain contact via cavities that are formed through the second contact-level dielectric layer 282, the first contact-level dielectric layer 280, and the second insulating cap layer 270 above top surfaces of the drain regions 63 within the memory stack structures 55. Top surfaces of the drain regions 63 are physically exposed at the bottom of the drain contact via cavities. The contact via cavities further include word line contact via cavities that are formed through the second contact-level dielectric layer 282, the first contact-level dielectric layer 280, the second insulating cap layer 270, and the second and first retro-stepped dielectric material portions (165, 265) by the anisotropic etch process. Top surfaces of the first and second electrically conductive layers (146, 246) are physically exposed at bottom regions of the word line contact via cavities.

At least one conductive material can be deposited in the contact via cavities. Excess portions of the at least one conductive material can be removed from above a horizontal plane including the top surface of the second contact-level dielectric layer 282 by a planarization process such as a recess etch process or a chemical mechanical planarization (CMP) process. Each remaining portion of the at least one conductive material in the word line contact via cavities constitutes a layer contact via structure 86, and each remaining portion of the at least one conductive material in the drain contact via cavities constitutes a drain contact via structure 88.

First contact via structures 86 within a first subset of the layer contact via structures 86 vertically extend through the second retro-stepped dielectric material portion 265 and the first retro-stepped dielectric material portion 165 and contact a top surface of a respective one of the first electrically conductive layers 146. Second contact via structures 86 within a second subset of the layer contact via structures 86 vertically extend through the second retro-stepped dielectric material portion 265 and contact a top surface of a respective one of the second electrically conductive layers 246. The first contact via structures 86 contacting a respective one of the second electrically conductive layers 246 may have an areal overlap with a respective underlying one of the auxiliary support pillar structures 128.

Referring to FIG. 16, at least one upper interconnect level dielectric layer 284 can be formed over the contact-level dielectric layers (280, 282). Various upper interconnect level metal structures can be formed in the at least one upper interconnect level dielectric layer 284. For example, the various upper interconnect level metal structures can include line-level metal interconnect structures (96, 98). The line-level metal interconnect structures (96, 98) can include bit lines 98 that contact a respective one of the drain contact via structures 88 and extend along the second horizontal direction (e.g., bit line direction) hd2 and perpendicular to the first horizontal direction (e.g., word line direction) hd1. Further, the line-level metal interconnect structures (96, 98) can include upper metal line structures 96 that contact a top surface of a respective one of the layer contact via structures 86 and/or another contact via structure (not shown) that vertically extend through the retro-stepped dielectric material portions (165, 265) or other dielectric material portions (not shown). Additional metal interconnect structures (not shown) and additional dielectric material layers (not shown) may be formed to provide electrical interconnection among the various components of a three-dimensional memory device in the first exemplary structure.

FIG. 16 is a vertical cross-sectional view of the first exemplary structure after formation of bit-line-level metal interconnect structures according to an embodiment of the present disclosure.

Referring to FIGS. 17A-17D, a second exemplary structure according to an embodiment of the present disclosure includes a first-tier structure, a second-tier structure formed over the first-tier structure, and a third-tier structure formed over the second-tier structure. The third-tier structure includes a third alternating stack of third insulating layers 332 and third electrically conductive layers 346 having third stepped surfaces, and a third retro-stepped dielectric material portion 365 located over, and contacting, the third stepped surfaces. The contact region 200 may have a first area 200A including the first stepped surfaces, a second area 200B including the second stepped surfaces, and a third area 200C including the third stepped surfaces. A third insulating cap layer 370 can be formed over the third alternating stack (332, 346), and a contact-level dielectric layer 380 can be formed over the third insulating cap layer 370.

In the second exemplary structure, auxiliary support pillar structures 128 that vertically extend only through the first-tier structure can be formed in the second area 200B of the contact region 200 that underlies the second stepped surfaces. The auxiliary support pillar structures 128 underly and do not extend through the second-tier structure. Additional auxiliary support pillar structures 228 that vertically extend through the first-tier structure and the second-tier structure can be formed in the third area 200C of the contact region 200 that underlies the third stepped surfaces. The additional auxiliary support pillar structures 228 underly and do not extend through the third-tier structure.

In this case, the third retro-stepped dielectric material portion 365 can overlie, and can contact, third stepped surfaces of the third alternating stack (332, 346). The memory stack structures 55 in the memory opening fill structures 58 vertically extend through each layer within the third alternating stack (332, 346), each layer within the second alternating stack (232, 246), and each layer within the first alternating stack (232, 246) other than the bottommost first insulating layer 132 and the bottommost first electrically conductive layer 146. The primary support pillar structures 20 can vertically extending through the third retro-stepped dielectric material portion 365, and the additional auxiliary support pillar structures 228 vertically extend through the first alternating stack (132, 246) and the second retro-stepped dielectric material portion 265, underlie the third stepped surfaces and have an areal overlap with the third stepped surfaces, and are located below a horizontal plane including a bottommost surface of the third alternating stack (332, 346).

Generally, N tier structures can be vertically stacked, and can be sequentially numbered beginning with 1 and ending with N, which is 2 or greater. Each i-th tier structure (in which i is an integer from 1 to N) can have an i-th stepped surfaces contacting i-th retro-stepped dielectric material portion. Memory opening fill structures 58 and primary support pillar structures 20 can vertically extend through each of the N tier structures, and auxiliary support pillar structures (128, 228) vertically extend through less than N tier structures (e.g., through N−1 structures), and thus, are shorter than the primary support pillar structures 20. The auxiliary support pillar structures (128, 228) are formed within areas of the contact region 200 such that the auxiliary support pillar structures (128, 228) do not contact any retro-stepped dielectric material portion (165, 265, 365). Thus, the auxiliary support pillar structures (128, 228) do not occupy a same volume as any of the layer contact via structures 86, and direct contact between the auxiliary support pillar structures (128, 228) and the layer contact via structures 86 can be avoided. Furthermore, the auxiliary support pillar structures (128, 228) comprise a different material from the primary support pillar structures 20. For example, the auxiliary support pillar structures (128, 228) comprise a single material (e.g., amorphous silicon) throughout their volume, while the primary support pillar structures 20 contain a memory film material 50 and a dummy vertical semiconductor channel material which is not electrically connected to any bit lines. The memory film material includes the materials of the blocking dielectric and charge storage dielectric and optionally tunneling dielectric which are different from each other as described above. The dummy vertical channel material is the same as the vertical semiconductor channel 60 material, and may comprise polysilicon.

The present inventors realized that insulating layer (132, 242) precipitates that may generated in the backside recesses 143 during the isotropic etching of the sacrificial material layers (142, 242). For example, if the sacrificial material layers (142, 242) include silicon nitride, silicon oxide precipitates may be generated in the backside recesses (143, 243) during a wet etch process employing hot phosphoric acid. The precipitates may block the electrically conductive layers (146, 246) from filling the backside recesses (143, 243) and/or may cause vertically adjacent electrically conductive layers (e.g., tungsten layers) to become electrically shorted to each other due to fluorine outgassing induced by the precipitates.

The present inventors also realized that the amount of the precipitates depends on the volume of the sacrificial material layers (142, 242) in a given region. The amount of the sacrificial material layer (142, 242) in the memory array region 100 is relatively low due to the presence of the high density of memory opening fill structures 58 extending through the sacrificial material layers (142, 242).

The density of the primary support pillar structures 20 located in the contact region 200 may be lower than the density of the memory opening fill structures 58 in the memory array region 100. Therefore, the volume of the first sacrificial material of the sacrificial material layers 142 located in the portion of the first-tier structure located in the second area 200B of the contact region 200 is higher than the volume of the sacrificial material of the same first sacrificial material layers 142 in the memory array region 100. Thus, the auxiliary support pillar structures 128 are added to the portion of the first-tier structure located in the second area 200B of the contact region 200 to reduce the volume of the sacrificial material of the first sacrificial material layers 142 because the auxiliary support pillar structures 128 extend through the first sacrificial material layers 142. Therefore, the auxiliary support pillar structures 128 reduce the amount of silica precipitates by reducing the volume of the first sacrificial material layers 142, and thus reduce the amount of electrode open circuits (i.e., incomplete filling of the backside recesses 143 by the electrically conductive layers 146) and/or short circuits (i.e., electrical contact by two vertically spaced electrically conductive layers 146).

In contrast, the amount of the sacrificial material in each sacrificial material layer 142 in the portion of the first-tier structure located in the first area 200A of the contact region 200 which contain the first steps S is relatively low because most sacrificial material layers 142 do not extend through the entire length of the first area 200A of the contact region 200. The same applies for the second sacrificial material layers 242 located in the second area 200B of the contact region 200. Therefore, the auxiliary support pillar structures 128 may be omitted in these regions.

FIGS. 18 and 19 illustrate the third exemplary structure of the third exemplary structure of the third embodiment of the present disclosure. As shown in FIG. 18, the auxiliary support pillar structures 128 may be located in all areas (e.g., in the first second and third areas) of the contact region 200. Optionally, only two rows of the auxiliary support pillar structures 128 may only be located between adjacent backside trenches 79 filled with the backside trench fill structures (74, 76). The first row of the auxiliary support pillar structures 128 may be located between a first backside trench 79 filled with the first backside trench fill structure (74, 76) and the nearest row of the primary support structures 20. The second row of the auxiliary support pillar structures 128 may be located between a second backside trench 79 filled with the second backside trench fill structure (74, 76) and another corresponding nearest row of the primary support structures 20. The two rows of the auxiliary support pillar structures 128 reduce or prevent pattern collapse (i.e., collapse of the insulating layers 132 of the first alternating stack) in the contact region 200 adjacent to the open backside trenches 79 after formation of the backside recesses 143.

In an alternative embodiment, there may be two rows of the auxiliary support pillar structures 128 located in the first area 200A of the contact region 200, as shown in FIG. 18, and more than two rows of the auxiliary support pillar structures 128 located in the second area 200A of the contact region 200 as shown in FIG. 14B.

The auxiliary support pillar structures 128 of the third embodiment may comprise any suitable material, such as a dielectric material (e.g., silicon oxide), or the sacrificial material (e.g., amorphous silicon) of the first embodiment. In one aspect of the third embodiment, if the auxiliary support pillar structures 128 comprise the dielectric material (e.g., silicon oxide), then the primary support pillar structures 20 may partially or entirely comprise the same dielectric material as the auxiliary support pillar structures 128.

For example, as shown in FIG. 19, the lower portion of the primary pillar structures 20 extending through the first alternating stack (142, 146) in the first tier consists entirely of the dielectric material 162, such as silicon oxide. The upper portion of the primary pillar structures 20 extending through the second alternating stack (242, 246) and through the joint region (e.g., through layers 170 and 180) comprise a same set of materials as the memory stack structures 55

(i.e., the material of a memory film 50 and the material of the vertical semiconductor channel 60). The upper portion of the primary pillar structures 20 extending through the second alternating stack (242, 246) and through the joint region (e.g., through layers 170 and 180) may comprise a same set of materials as the memory opening fill structures ((i.e., the material of a memory film 50, the material of the vertical semiconductor channel 60, the material of the dielectric core 62 and the material of the drain region 63).

The structure of FIG. 19 may be formed using the method illustrated in FIGS. 1 to 15D of the first embodiment with the following modifications. First, a dielectric material, such as silicon oxide, is formed in first-tier support openings 119 and auxiliary support openings 129 in the step shown in FIG. 5A, while the first-tier memory openings 149 are covered with a masking material. The masking material may comprise a photoresist material or an amorphous carbon material bridge (e.g., Advanced Patterning Film (APF) available from Applied Materials, Inc.). This forms the dielectric (e.g., silicon) auxiliary support pillar structures 128 and dielectric lower portions 162 of the primary support pillar structures 20. The masking material is then removed, and the first-tier memory openings 149 are filled with the first-tier sacrificial memory opening fill structures 148 which comprise a different material (e.g., amorphous silicon) from the dielectric material of the dielectric auxiliary support pillar structures 128 and dielectric lower portions 162 of the primary support pillar structures 20.

Second, the sacrificial memory opening fill structures 148 are removed by selective etching during the step shown in FIG. 8A, without removing the dielectric material of the dielectric auxiliary support pillar structures 128 and dielectric lower portions 162 of the primary support pillar structures 20. Thus, the memory openings 49 are formed in the memory array region 100 while the dielectric material of the dielectric auxiliary support pillar structures 128 and dielectric lower portions 162 of the primary support pillar structures 20 remain in the contact region 200. The top surface of the dielectric lower portions 162 of the primary support pillar structures 20 are exposed at the bottom of the support openings 19 which extend only to the top of the first alternating stack (132, 142).

Third, during the formation of the memory opening fill structures 58 shown in FIGS. 9A-9H, the materials of the memory opening fill structures 58 are also formed in the support openings 19 to form the upper portions of the support structures, as shown in FIG. 19.

Referring to all drawings and according to various embodiments of the present disclosure, a three-dimensional memory device is provided, which comprises: a first-tier structure (132, 146, 165) located over a substrate and comprising a first alternating stack of first insulating layers 132 and first electrically conductive layers 146 and comprising a first retro-stepped dielectric material portion 165 overlying, and contacting, first stepped surfaces of the first alternating stack (132, 146); a second-tier structure (232, 246, 265) located over the first-tier structure (132, 146, 165) and comprising a second alternating stack of second insulating layers 232 and second electrically conductive layers 246 and comprising a second retro-stepped dielectric material portion 265 overlying, and contacting, second stepped surfaces of the second alternating stack (232, 246); memory stack structures 55 vertically extending through the first alternating stack (132, 146) and the second alternating stack (232, 246), wherein each of the memory stack structures 55 comprises a memory film 50 and a vertical semiconductor channel 60; primary support pillar structures 20, wherein a portion of the primary support pillar structures 20 vertically extend through the second retro-stepped dielectric material portion 265, the first alternating stack and the second alternating stack; and auxiliary support pillar structures 128 vertically extending through the first alternating stack (132, 146), underlying the second stepped surfaces, and located below a horizontal plane including a bottommost surface of the second alternating stack (232, 246).

In one embodiment, top surfaces of the auxiliary support pillar structures 128 contact the bottommost surface of the second alternating stack (232, 246). In one embodiment, the auxiliary support pillar structures 128 contact each first insulating layer 132 within the first alternating stack (132, 146). In one embodiment, the auxiliary support pillar structures 128 do not contact the first retro-stepped dielectric material portion 165. In one embodiment, the auxiliary support pillar structures 128 are interlaced with a first subset of the primary support pillar structures 20 that vertically extend through the second stepped surfaces. In one embodiment, a second subset of the primary support pillar structures 20 vertically extend through the first stepped surfaces; and the first stepped surfaces do not contact any of the auxiliary support pillar structures 128.

In one embodiment, each of the first subset of the primary support pillar structures 20, the second subset of the primary support pillar structures 20, and the auxiliary support pillar structures 128 is arranged as a respective periodic two-dimensional array having a same first pitch along a first horizontal direction hd1 and having a same second pitch along a second horizontal direction hd1; and the auxiliary support pillar structures 128 are laterally offset from the first subset of the primary support pillar structures 20 by one half of the second pitch along the second horizontal direction hd2.

In one embodiment, the primary support pillar structures 20 comprise a same set of materials as the memory stack structures 55 (i.e., the material of a memory film 50 and the material of the vertical semiconductor channel 60). In one embodiment, the primary support pillar structures 20 comprise a combination of a semiconductor material having a same composition as the vertical semiconductor channel 60 and dielectric materials having same material compositions as components of the memory film 50. In one embodiment, the auxiliary support pillar structures 128 comprise an auxiliary fill material that is different from the dielectric materials in the memory film 50. In one embodiment, the auxiliary fill material comprises a semiconductor material (e.g., amorphous silicon) that is intrinsic or includes dopants at an atomic concentration less than $1.0 \times 10^{15}/cm^3$.

In one embodiment, the first stepped surfaces continuously extend from a bottommost layer within the first alternating stack (132, 146) to a topmost layer within the first alternating stack (132, 146) and contacts vertical surfaces and horizontal bottom surfaces of the first retro-stepped dielectric material portion 165; and the second stepped surfaces continuously extend from a bottommost layer within the second alternating stack (232, 246) to a topmost layer within the second alternating stack (232, 246) and contacts vertical surfaces and horizontal bottom surfaces of the second retro-stepped dielectric material portion 265.

In one embodiment, contact via structures (such as a subset of the layer contact via structures 86) vertically extend through the second retro-stepped dielectric material portion 265 and contact a respective one of the second electrically conductive layers 246 within the second alternating stack (232, 246), wherein the contact via structures have an areal overlap with a subset of the auxiliary support pillar structures 128.

In one embodiment, the three-dimensional memory device comprises a third-tier structure located over the second-tier structure (232, 246) and comprising a third alternating stack of third insulating layers 332 and third electrically conductive layers 346 and comprising a third retro-stepped dielectric material portion 365 overlying, and contacting, third stepped surfaces of the third alternating stack (332, 346), wherein: the memory stack structures 55 vertically extend through each layer within the third alternating stack (332, 346); and the primary support pillar structures 20 vertically extending through the third retro-stepped dielectric material portion 365; and additional auxiliary support pillar structures 218 vertically extend through the first alternating stack (132, 146) and the second retro-stepped dielectric material portion 265, underlie the third stepped surfaces, and are located below a horizontal plane including a bottommost surface of the third alternating stack (332, 346).

In one embodiment, a pair of backside trench fill structures (74, 76) can be provided, which laterally extend along a first horizontal direction hd1. Each of the pair of backside trench fill structures (74, 76) comprises: an insulating spacer 74 contacting each layer within the first alternating stack (132, 146) and contacting each layer within the second alternating stack (232, 246); and a backside contact via structure 76 laterally surrounded by the insulating spacer 74 and contacting the substrate.

In one embodiment, the vertical semiconductor channel 60 that is electrically connected to a semiconductor material layer 9 within the substrate, and the memory film 50 contacting the vertical semiconductor channel 60.

In one aspect of the third embodiment, the auxiliary support pillar structures 128 comprise a first dielectric material (e.g., silicon oxide) and the entire primary support pillar structures 20 comprise the first dielectric material. In another aspect of the third embodiment the auxiliary support pillar structures 128 comprise a first dielectric material (e.g., silicon oxide), entire lower portions 162 of the primary support pillar structures 20 comprise the first dielectric material, and upper portions of the primary support pillars 20 comprise a same set of materials as the memory stack structures 55.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
a first-tier structure located over a substrate and comprising a first alternating stack of first insulating layers and first electrically conductive layers and comprising a first retro-stepped dielectric material portion overlying, and contacting, first stepped surfaces of the first alternating stack;
a second-tier structure located over the first-tier structure and comprising a second alternating stack of second insulating layers and second electrically conductive layers and comprising a second retro-stepped dielectric material portion overlying, and contacting, second stepped surfaces of the second alternating stack;
memory stack structures vertically extending through the first alternating stack and the second alternating stack, wherein each of the memory stack structures comprises a memory film and a vertical semiconductor channel;
primary support pillar structures, wherein each of the primary support pillar structures vertically extends through the second retro-stepped dielectric material portion, the first alternating stack and the second alternating stack; and
auxiliary support pillar structures vertically extending through the first alternating stack, underlying the second stepped surfaces, and located below a horizontal plane including a bottommost surface of the second alternating stack, wherein the auxiliary support pillar structures do not contact the first retro-stepped dielectric material portion.

2. The three-dimensional memory device of claim 1, wherein top surfaces of the auxiliary support pillar structures contact the bottommost surface of the second alternating stack.

3. The three-dimensional memory device of claim 1, wherein the auxiliary support pillar structures contact each first insulating layer within the first alternating stack.

4. The three-dimensional memory device of claim 1, wherein the auxiliary support pillar structures are interlaced with a first subset of the primary support pillar structures that vertically extend through the second stepped surfaces.

5. The three-dimensional memory device of claim 4, wherein:
a second subset of the primary support pillar structures vertically extend through the first stepped surfaces; and
the first stepped surfaces do not contact any of the auxiliary support pillar structures.

6. The three-dimensional memory device of claim 5, wherein:
each of the first subset of the primary support pillar structures, the second subset of the primary support pillar structures, and the auxiliary support pillar structures is arranged as a respective periodic two-dimensional array having a same first pitch along a first horizontal direction and having a same second pitch along a second horizontal direction; and
the auxiliary support pillar structures are laterally offset from the first subset of the primary support pillar structures by one half of the second pitch along the second horizontal direction.

7. The three-dimensional memory device of claim 4, wherein:
the auxiliary support pillar structures are arranged in multiple rows such that each row of the multiple rows is arranged along a second horizontal direction that is perpendicular to the first horizontal direction; and
rows of the first subset of the primary support pillar structures are interlaced with the rows of multiple rows of the auxiliary support pillar structures.

8. The three-dimensional memory device of claim 1, wherein:
the primary support pillar structures comprise a same set of materials as the memory stack structures; and
the auxiliary support pillar structures comprise an auxiliary fill material that is different from the dielectric materials in the memory film.

9. The three-dimensional memory device of claim 1, wherein:
the first stepped surfaces continuously extend from a bottommost layer within the first alternating stack to a topmost layer within the first alternating stack and contacts vertical surfaces and horizontal bottom surfaces of the first retro-stepped dielectric material portion; and
the second stepped surfaces continuously extend from a bottommost layer within the second alternating stack to a topmost layer within the second alternating stack and contacts vertical surfaces and horizontal bottom surfaces of the second retro-stepped dielectric material portion.

10. The three-dimensional memory device of claim 1, further comprising contact via structures vertically extending through the second retro-stepped dielectric material portion and contacting a respective one of the second electrically conductive layers within the second alternating stack, wherein the contact via structures have an areal overlap with a subset of the auxiliary support pillar structures.

11. The three-dimensional memory device of claim 1, further comprising:
a third-tier structure located over the second-tier structure and comprising a third alternating stack of third insulating layers and third electrically conductive layers and comprising a third retro-stepped dielectric material portion overlying, and contacting, third stepped surfaces of the third alternating stack; and
additional auxiliary support pillar structures;
wherein:
the memory stack structures vertically extend through each layer within the third alternating stack; and
the primary support pillar structures vertically extending through the third retro-stepped dielectric material portion; and
the additional auxiliary support pillar structures vertically extend through the first alternating stack and the second retro-stepped dielectric material portion, underlie the third stepped surfaces, and are located below a horizontal plane including a bottommost surface of the third alternating stack.

12. The three-dimensional memory device of claim 1, wherein the auxiliary support pillar structures comprise a first dielectric material and the entire primary support pillar structures comprise the first dielectric material.

13. The three-dimensional memory device of claim 1, wherein:
the auxiliary support pillar structures comprise a first dielectric material;
entire lower portions of the primary support pillar structures comprise the first dielectric material; and
upper portions of the primary support pillars comprise a same set of materials as the memory stack structures.

14. The three-dimensional memory device of claim 1, wherein each of the primary support pillar structures has a respective top surface located above a horizontal plane including a topmost surface of the second alternating stack.

15. The three-dimensional memory device of claim 14, wherein each of the auxiliary support pillar structures has a respective top surface located within a horizontal plane including a bottommost surface of the second alternating stack.

16. The three-dimensional memory device of claim 1, wherein the second subset of the primary support pillar structures vertically extends at least from a top surface of the second retro-stepped dielectric material portion and at least to a bottom surface of the second retro-stepped dielectric material portion.

17. The three-dimensional memory device of claim 1, wherein the second subset of the primary support pillar structures vertically extends through a respective subset of the first insulating layers and the first electrically conductive layers within the first alternating stack.

18. The three-dimensional memory device of claim 1, further comprising a source region embedded within a semiconductor material layer in the substrate, wherein:
the semiconductor material layer has a doping of a first conductivity type; and
the source region has a doping of a second conductivity type that is an opposite of the first conductivity type.

19. The three-dimensional memory device of claim 1, wherein:
each of the auxiliary support pillar structures has a first height; and
each of the primary support pillar structures has a second height that is greater than the first height.

20. The three-dimensional memory device of claim 1, wherein:
a first subset of the primary support pillar structures does not contact the first retro-stepped dielectric material portion; and
a second subset of the primary support pillar structures directly contacts the first retro-stepped dielectric material portion.

* * * * *